United States Patent
Tagawa et al.

(10) Patent No.: US 6,636,773 B1
(45) Date of Patent: Oct. 21, 2003

(54) SEMICONDUCTOR MEMORY CARD, APPARATUS FOR RECORDING DATA ONTO THE SEMICONDUCTOR MEMORY CARD, AND APPARATUS FOR REPRODUCING DATA OF THE SEMICONDUCTOR MEMORY CARD

(75) Inventors: Kenji Tagawa, Katano (JP); Hideki Matsushima, Studio City, CA (US); Teruto Hirota, Moriguchi (JP); Tomokazu Ishikawa, Toyonaka (JP); Shinji Inoue, Neyagawa (JP); Masayuki Kozuka, Arcadia, CA (US)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/580,818

(22) Filed: May 26, 2000

(30) Foreign Application Priority Data

| May 28, 1999 | (JP) | ............................................. | 11-149893 |
| Aug. 24, 1999 | (JP) | ............................................. | 11-236724 |
| Dec. 28, 1999 | (JP) | ............................................. | 11-372787 |

(51) Int. Cl.$^7$ ......................... G06F 17/00; G06F 12/00; G11B 7/085
(52) U.S. Cl. ....................... 700/94; 364/30.04; 711/112
(58) Field of Search ................................. 711/170, 150, 711/115; 700/94; 369/30.04, 30.08

(56) References Cited

U.S. PATENT DOCUMENTS

| 5,418,718 A | * | 5/1995 | Lim et al. .................... 715/536 |
| 5,802,482 A | * | 9/1998 | Sun ................................ 704/8 |
| 5,889,481 A | * | 3/1999 | Okada .......................... 341/51 |
| 6,094,634 A | * | 7/2000 | Yahagi et al. .................. 341/90 |
| 6,252,984 B1 | * | 6/2001 | Haneda et al. ............... 382/181 |
| 6,262,956 B1 | * | 7/2001 | Tsuda ...................... 369/47.16 |
| 6,295,267 B1 | * | 9/2001 | Takaku et al. ........... 369/47.13 |
| 6,404,676 B2 | * | 6/2002 | Kihara et al. .......... 365/185.12 |
| 6,519,676 B1 | * | 2/2003 | Suzuki et al. ................ 711/112 |

FOREIGN PATENT DOCUMENTS

| EP | 0 702 366 | 3/1996 |
| JP | 08016568 | 1/1996 |

* cited by examiner

Primary Examiner—Forester W. Isen
Assistant Examiner—Laura A Grier
(74) Attorney, Agent, or Firm—Wenderoth, Lind & Ponack, L.L.P.

(57) ABSTRACT

A semiconductor memory card for storing audio information with corresponding text information and type information, the type information indicating a type of the text information. The type is classified into at least (a), (b), and (c) in which the text information respectively includes a 1-byte character code sequence, a 2-byte character code sequence, and a 1-byte character code sequence and a 2-byte character code sequence.

14 Claims, 24 Drawing Sheets

USER DATA AREA

PROTECTED AREA

FIG. 9A

| TEXT 1 ATTRIBUTE (TKI_TI1_ATR) | MEANING |
|---|---|
| 00h | NO 1-BYTE CHARACTER CODE SEQUENCE |
| 01h | ISO646 |
| 02h | JISX0201 |
| 03h | ISO 8859-1 |
| OTHERS | — |

FIG. 9B

| TEXT 2 ATTRIBUTE (TKI_TI2_ATR) | MEANING |
|---|---|
| 00h | NO 2-BYTE CHARACTER CODE SEQUENCE |
| 81h | Music Shift JIS Kanji |
| OTHERS | — |

FIG. 11

| ITEM | TAG(1-BYTE) | TAG(2-BYTE) |
|---|---|---|
| TITLE | 01h | 0001h |
| ARTIST | 02h | 0002h |
| ALBUM TITLE | 03h | 0003h |
| LYRICIST | 04h | 0004h |
| COMPOSER | 05h | 0005h |
| ARRANGER | 06h | 0006h |
| PRODUCER | 07h | 0007h |
| RECORD COMPANY | 08h | 0008h |
| ARTIST'S MESSAGE | 09h | 0009h |
| USER'S COMMENT | 0Ah | 000Ah |
| PROVIDER'S COMMENT | 0Bh | 000Bh |
| DATE | 0Ch | 000Ch |
| GENRE | 0Dh | 000Dh |
| URL | 0Eh | 000Eh |
| FREE ITEM 1 | 0Fh | 000Fh |
| FREE ITEM 2 | 10h | 0010h |
| FREE ITEM 3 | 11h | 0011h |
| FREE ITEM 4 | 12h | 0012h |
| FREE ITEM 5 | 13h | 0013h |
| FREE ITEM 6 | 14h | 0014h |

FIG. 13

| 00 : 00 |
|---|
| ★the title⇒☆the artis |

| 00 : 01 |
|---|
| title⇒☆the artis⇒◆t |

| 00 : 02 |
|---|
| ⇒☆the artist⇒◆the al |

| 00 : 03 |
|---|
| the artist⇒◆the album |

| 00 : 04 |
|---|
| rtist⇒◆the album title |

| 00 : 05 |
|---|
| t⇒◆the album title⇒★ |

| 00 : 06 |
|---|
| album title⇒★the titl |

| 00 : 07 |
|---|
| title⇒★the title⇒☆th |

| 00 : 08 |
|---|
| the title⇒☆the artist |

FIG. 14

| playlist |
|---|
| ★the title1⇒★the tit |

| playlist |
|---|
| e title1⇒★the title 2 |

| playlist |
|---|
| le 1⇒★the title 2⇒★t |

| playlist |
|---|
| ★the title 2⇒★the tit |

| playlist |
|---|
| title 2⇒★the title 3⇒ |

| playlist |
|---|
| ★the title 3⇒★the ti |

| playlist |
|---|
| title 3⇒★the title 4⇒ |

| playlist |
|---|
| 3⇒★the title 4⇒★the |

FIG. 15

★the title  
00 : 00  
☆the artist⇒◆the album title⇒○the lyricist⇒◎t

★the title  
00 : 02  
title⇒○the lyricist⇒◎the composer⇒●the arrange

★the title  
00 : 04  
composer⇒●the arranger⇒■the producer⇒□the r

★the title  
00 : 06  
■the producer⇒□the record company⇒△the arti

★the title  
00 : 08  
□the record company⇒△the artist's message⇒▽

★the title  
00 : 10  
artist's message⇒▽the user's comment⇒♯the pro

FIG. 16

| 00:00 |
| ★タイトル名⇒☆アーティ |

| 00:01 |
| トル名⇒☆アーティスト名 |

| 00:02 |
| ⇒☆アーティスト名⇒◆ア |

| 00:03 |
| ーティスト名⇒◆アルバム |

| 00:04 |
| スト名⇒◆アルバム名⇒★ |

| 00:05 |
| ⇒◆アルバム名⇒★タイト |

| 00:06 |
| ルバム名⇒★タイトル名⇒ |

| 00:07 |
| 名⇒★タイトル名⇒☆アー |

| 00:08 |
| タイトル名⇒☆アーティス |

FIG. 17

| プレイリスト |
| --- |
| ★タイトル名1⇒★タイト |

| プレイリスト |
| --- |
| トル名1⇒★タイトル名2 |

| プレイリスト |
| --- |
| 2⇒★タイトル名2⇒★タ |

| プレイリスト |
| --- |
| タイトル名2⇒★タイトル |

| プレイリスト |
| --- |
| ル名2⇒★タイトル名3⇒★ |

| プレイリスト |
| --- |
| ★タイトル名3⇒★タイト |

| プレイリスト |
| --- |
| トル名3⇒★タイトル名4 |

| プレイリスト |
| --- |
| 3⇒★タイトル名4⇒★タ |

| TEXT 1 ATTRIBUTE | TEXT 2 ATTRIBUTE | CHARACTER INFORMATION TYPE | |
|---|---|---|---|
| YES(≠00h) | NO(=00h) | (a) | (CONTAINS ONLY 1-BYTE CHARACTER CODE SEQUENCE) |
| NO(=00h) | YES(≠00h) | (b) | (CONTAINS ONLY 2-BYTE CHARACTER CODE SEQUENCE) |
| YES(≠00h) | YES(≠00h) | (c) | (CONTAINS BOTH) |
| NO(=00h) | NO(=00h) | (d) | (CONTAINS NEITHER) |

FIG. 22

| USER SPECIFICATION | CHARACTER INFORMATION TYPE | DISPLAY CHARACTER |
|---|---|---|
| 1-BYTE CHARACTER | (a) OR (c) | 1-BYTE CHARACTER |
| 1-BYTE CHARACTER | (b) OR (d) | NO DISPLAY |
| 2-BYTE CHARACTER | (b) OR (c) | 2-BYTE CHARACTER |
| 2-BYTE CHARACTER | (a) OR (d) | NO DISPLAY |

FIRST TERMINATED CODE   SECOND TERMINATED CODE

FIRST TERMINATED CODE   SECOND TERMINATED CODE

FIRST TERMINATED CODE   SECOND TERMINATED CODE

FIRST TERMINATED CODE   SECOND TERMINATED CODE

SEMICONDUCTOR MEMORY CARD, APPARATUS FOR RECORDING DATA ONTO THE SEMICONDUCTOR MEMORY CARD, AND APPARATUS FOR REPRODUCING DATA OF THE SEMICONDUCTOR MEMORY CARD

BACKGROUND OF THE INVENTION (1) Field of the Invention

The present invention relates to a semiconductor memory card for recording digital data representing audio data or image data, an apparatus for recording data onto the semiconductor memory card, and an apparatus for reproducing data stored in the semiconductor memory card.

(2) Description of the Prior Art

Atypical rewritable recording medium for recording digital data is an MD (Mini Disc) that has come into wide use. Portable MD recording/reproducing apparatuses that can record audio information from music CDs have also become prevalent.

Typical MDs have approximately 140 MB of storage capacity and can record approximately 74 minutes of music by recording compressed digital audio data. MDs can also record up to approximately 1,700 characters of information for showing tune titles, a disc title and the like, as well as audio information. The recorded character information often includes a mixture of hankaku katakana (Japanese. alphabet) characters, alphabets, numerals, and signs. It should be noted here that katakana characters used for computers are classified into hankaku katakana and zenkaku katakana characters. The hankaku katakana characters are represented by 1-byte character codes and displayed with a half width of zenkaku katakana. The zenkaku katakana is represented by 2-byte character codes. MD recording/reproducing apparatuses that can record hiragana (Japanese alphabet) characters and kanji characters (Chinese characters) have recently become commercially available.

However, the above conventional techniques have a problem that MD reproducing apparatuses (of the types that do not have Chinese character fonts), which can display only hankaku katakana characters, alphabets, numerals, and signs, cannot properly display hiragana and Chinese characters recorded in recording mediums. With such apparatuses, users cannot recognize tune titles and the like.

SUMMARY OF THE INVENTION

It is therefore an object of the present invention to provide a semiconductor memory card which enables a recording/reproducing apparatus to display character information in the semiconductor memory card properly whether the recording/reproducing apparatus can display only hankaku katakana characters and alphanumerics or can display further hiragana and Chinese characters.

The above object is fulfilled by a semiconductor memory card for storing audio information with corresponding text information and type information, the type information indicating a type of the text information, wherein the type is classified into at least (a), (b), and (c) in which the text information respectively includes a 1-byte character code sequence, a 2-byte character code sequence, and a 1-byte character code sequence and a 2-byte character code sequence.

The above object is also fulfilled by a recording apparatus for recording audio information onto a semiconductor memory card which can be inserted into and/or removed from the recording apparatus, the recording apparatus comprising: a first recording device operable to record the audio information onto the semiconductor memory card; and a second recording device operable to record text information and type information both corresponding to the audio information onto the semiconductor memory card, wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence.

The above object is also fulfilled by a reproducing apparatus for reading out audio information from a semiconductor memory card which can be inserted into and/or removed from the reproducing apparatus and. reproducing the read-out audio information, the reproducing apparatus comprising: a read-out device operable to read out the audio information, text information, and type information from the semiconductor memory card, wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence; a reproducing device operable to reproduce the read-out audio information; and a control device operable to control a display unit to display either a 1-byte character code sequence or a 2-byte character code sequence in accordance with the read-out type information.

With the above construction, the semiconductor memory card can record the text information properly when the type of the text information is (a), (b), or (c). Therefore, the text information recorded in the semiconductor memory card is properly displayed by a recording/reproducing apparatus by referring to the type information when the recording/reproducing apparatus supports (1) a 1-byte character code sequence, (2) a 2-byte character code sequence, or (3) both a 1-byte character code sequence and a 2-byte character code sequence.

In the above semiconductor memory card, the type information may include a first attribute and a second attribute, the first attribute showing whether the text information includes a 1-byte character code sequence, and the second attribute showing whether the text information includes a 2-byte character code sequence, and the first attribute, the second attribute, and a combination of the two attributes respectively indicate the types (a), (b), and (c).

With the above construction, the reproducing apparatus can easily determine the type out of the types including (a) to (c) by referring to the first attribute, the second attribute, and a combination of the first attribute and the second attribute read out from the semiconductor memory card.

In the above semiconductor memory card, the text information may be stored in a text storage area, which is a part of the semiconductor memory card, consecutively from the start of the text storage area, the type information is a first terminated code and a second terminated code which are included in the text information, the first terminated code is stored at the start of the text storage area when the text information stored in the text storage area does not include a 1-byte character code sequence, and is stored in the text storage area at the end of a 1-byte character code sequence when the text information stored in the text storage area includes the 1-byte character code sequence, the second terminated code is stored in the text storage area at a position immediately after the first terminated code when the text information stored in the text storage area does not include a 2-byte character code sequence, and is stored in the text storage area at the end of a 2-byte character code sequence when the text information stored in the text storage area includes the 2-byte character code sequence, and combinations of what is stored at the start of the text storage area, a storage position of the first terminated code, and a storage position of the second terminated code indicate the types (a), (b), and (c).

With the above construction, the reproducing apparatus can easily determine the type out of the types including (a) to (c) from the combinations of what is stored at the start of the text storage area, a storage position of the first terminated code, and a storage position of the second terminated code.

In the above semiconductor memory card, the 1-byte character code sequence may include pairs of a 1-byte tag and a plurality of 1-byte character codes, the 1-byte tag indicating a name of an item, and the plurality of 1-byte character codes indicating a content of the item, and the 2-byte character code sequence includes pairs of a 2-byte tag and a plurality of 2-byte character codes, the 2-byte tag indicating a name of an item, and the plurality of 2-byte character codes indicating a content of the item.

With the above construction, each of the 1-byte character code sequence and the 2-byte character code sequence includes pairs of a tag and a character code sequence, the tag indicating a type of an item, and the character code sequence indicating a content of the item. As a result, the area for storing the character information is used with efficiency.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIGS. 9A and 9B show specific examples of a text 1 attribute and a text 2 attribute;

FIG. 11 shows tags indicating types of items;

FIG. 13 shows an example of characters displayed on the LCD unit while the audio information is being reproduced, where the LCD unit is attached to a portable reproducing apparatus and is approximately as large as 24 hankaku characters=2 rows;

FIG. 14 shows an example of a play list displayed on the LCD unit attached to a portable reproducing apparatus;

FIG. 15 shows an example of characters displayed on the LCD unit while the audio information is being reproduced, where the LCD unit is attached to a car-mounted type reproducing apparatus and is approximately as large as 48 hankaku characters=4 rows;

FIG. 16 shows an example of characters displayed on a display unit while audio information is reproduced, where the display unit is as large as 12 2-byte characters=2 rows;

FIG. 17 shows an example of displayed play list;

FIG. 18 shows an example of characters displayed on a display unit while audio information is reproduced, where the display unit is as large as 24 2-byte characters=4 rows;

FIG. 21 shows a determination logic used to determine a character information type from a combination of the text 1 attribute and the text 2 attribute;

FIG. 22 shows a determination logic used to determine a display type based on specification of either of 1-byte and 2-byte by the user and the determined character information type;

DESCRIPTION OF THE PREFERRED EMBODIMENTS

Figure 1:
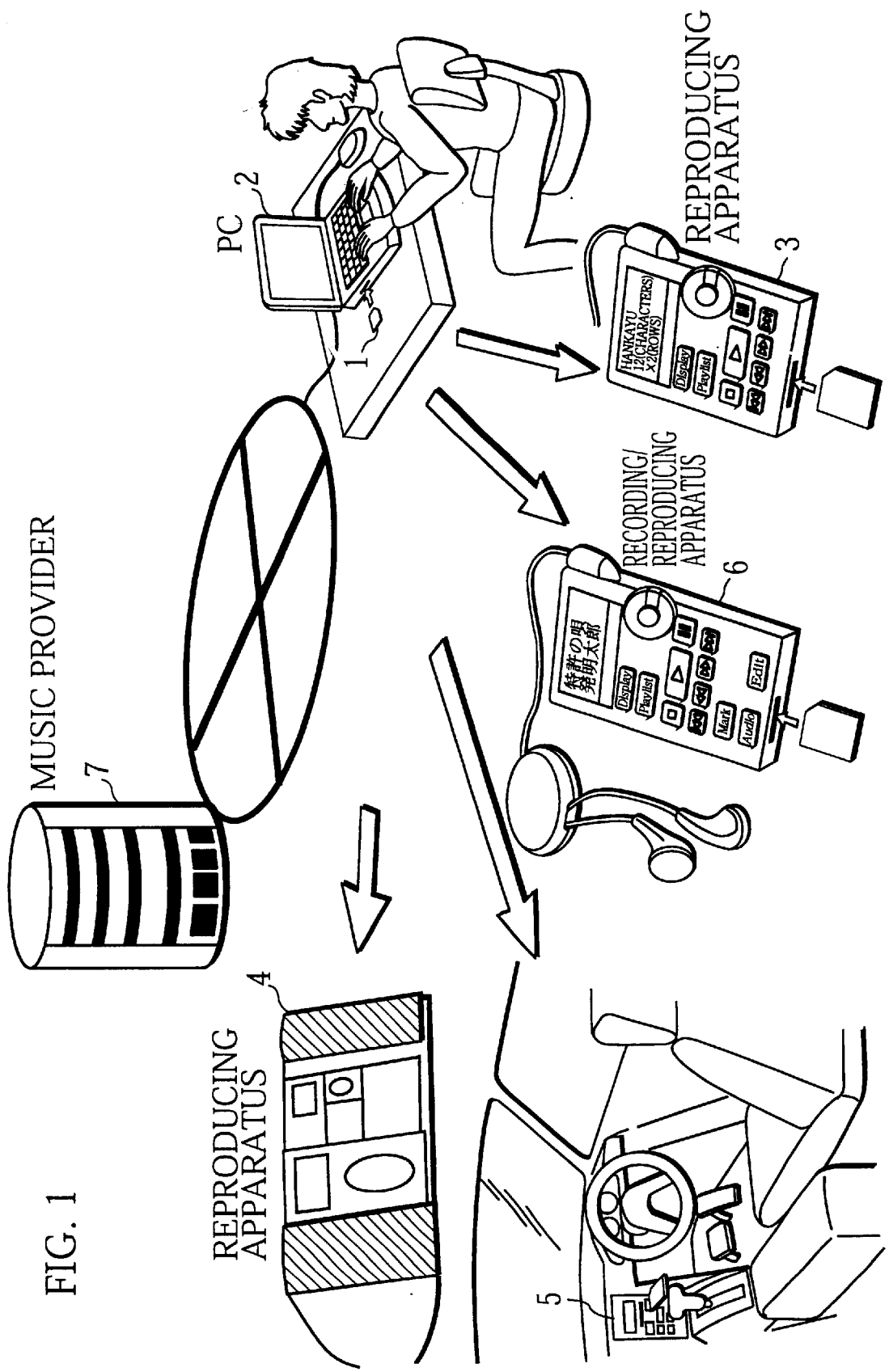
FIG. 1 is a schematic representation of the semiconductor memory card, the recording apparatus, and the reproducing apparatus in the embodiment of the present invention.

The following are description of the present invention through specific embodiments thereof by way of referring to the drawings.

FIG. 1 is a schematic representation of the semiconductor memory card (hereinafter, referred to as media card), the recording apparatus, and the reproducing apparatus of the present invention.

In FIG. 1, the media card 1 can be inserted into and/or removed from a recording/reproducing apparatus 2, reproducing apparatuses 3 to 5, and a recording/reproducing apparatus 6, and can record a plurality of pieces of audio information and a plurality of pieces of character information. Note that each piece of audio information is a music tune, a section of a novel, an English conversation lesson or the like. Each piece of character information corresponds to a piece of audio information and includes a first data and a second data. The first data is composed of a sequence of 1-byte character codes which represent attributes including the name of the piece of audio information. The second data is composed of a sequence of 2-byte character codes representing the same attributes as the first data. The first data includes 1-byte character codes which each represent an alphanumeric character, a hankaku katakana character or the like. The second data includes 2-byte character codes which each represent a hiragana character, a Chinese character, a character sequence of other languages or the like. With this arrangement, character information is displayed on both apparatuses: an apparatus that can display only 1-byte character codes; and an apparatus that can also display 2-byte character codes.

The recording/reproducing apparatus 2, being a personal computer, records/reproduces data stored in the media card 1 inserted into a slot of the recording/reproducing apparatus 2. For example, the recording/reproducing apparatus 2 obtains audio or character information distributed by a music provider 7 via a telephone line or the Internet, generates audio information based on music CDs, generates character information in accordance with user operations, writes audio or character information to the media card 1 inserted into the slot, reads out audio or character information from the media card 1, or reproduces or edits the read-out information.

The reproducing apparatus 3 is a portable reproducing apparatus having a slot into which the media card 1 can be inserted. The reproducing apparatuses 4 and 5 are respectively a tabletop apparatus and a car-mounted apparatus which read out audio information from the media card 1 to reproduce the read-out audio information and display the read-out character information. Each of the reproducing apparatuses 3 to 5 reads out and displays the first data when the apparatus contains a ROM prestoring fonts for 1-byte character codes, and reads out and displays the second data when the apparatus contains a ROM prestoring fonts for 2-byte character codes.

The recording/reproducing apparatus 6 is a portable apparatus having a function of recording audio and character information, in addition to the function of the reproducing apparatus 3.

Figure 2:
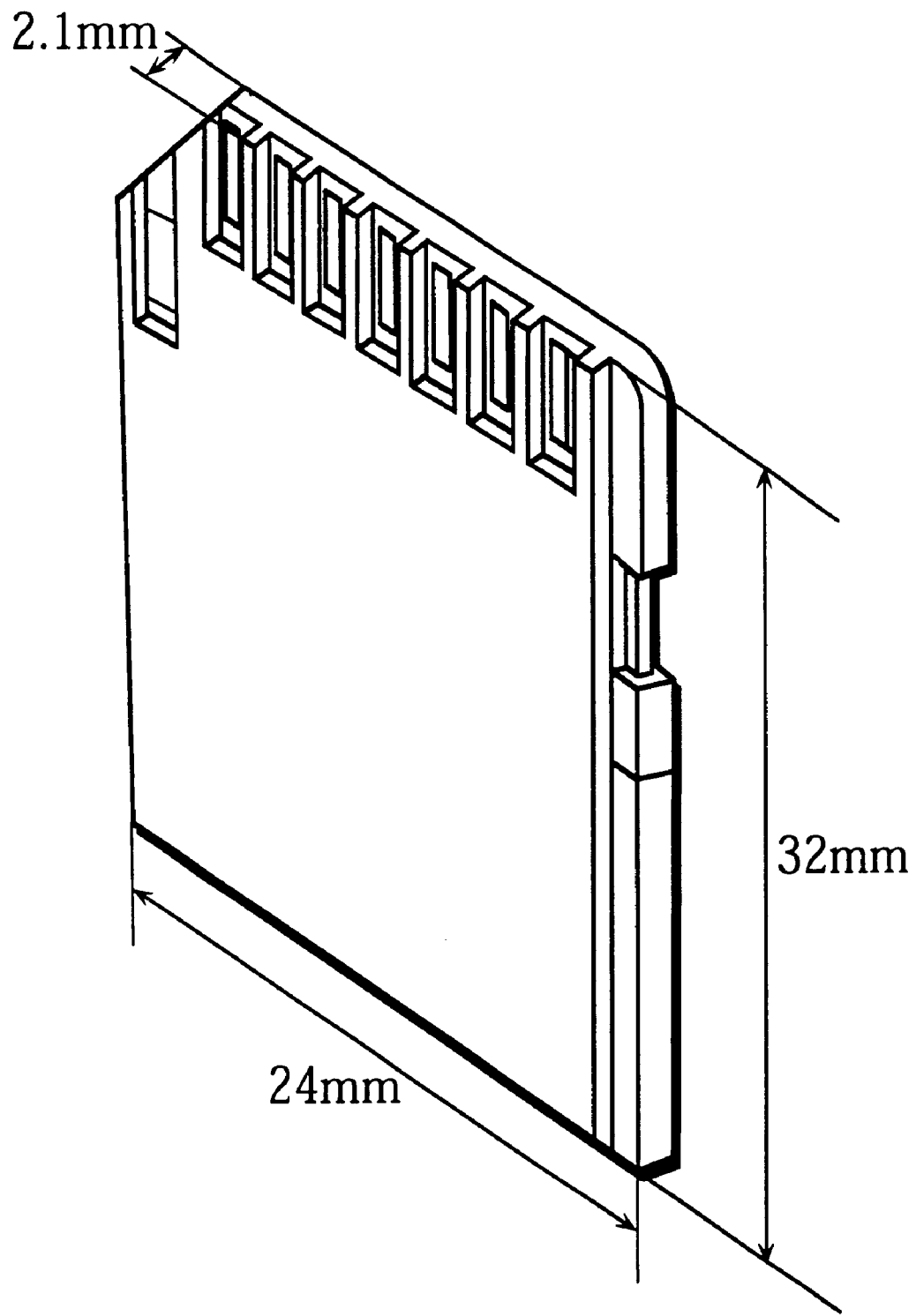
FIG. 2 shows the appearance of the semiconductor memory card (media card 1)

The music provider 7 distributes audio and character information via telephone lines or the Internet. cl Semiconductor Memory Card FIG. 2 shows the appearance of the media card 1. As shown in FIG. 2, the media card 1 is 2.1 mm-thick, 24 mm-wide, and 32 mm-deep, contains a nonvolatile semiconductor memory device such as a flash memory, and includes terminals which are electrically connected to a reproducing apparatus or a recording apparatus when the media card 1 is inserted into such an apparatus.

The media card 1 will be described in terms of a physical layer, a file system layer, and an application layer shown in FIG. 4.

Physical Layer

Figure 3:
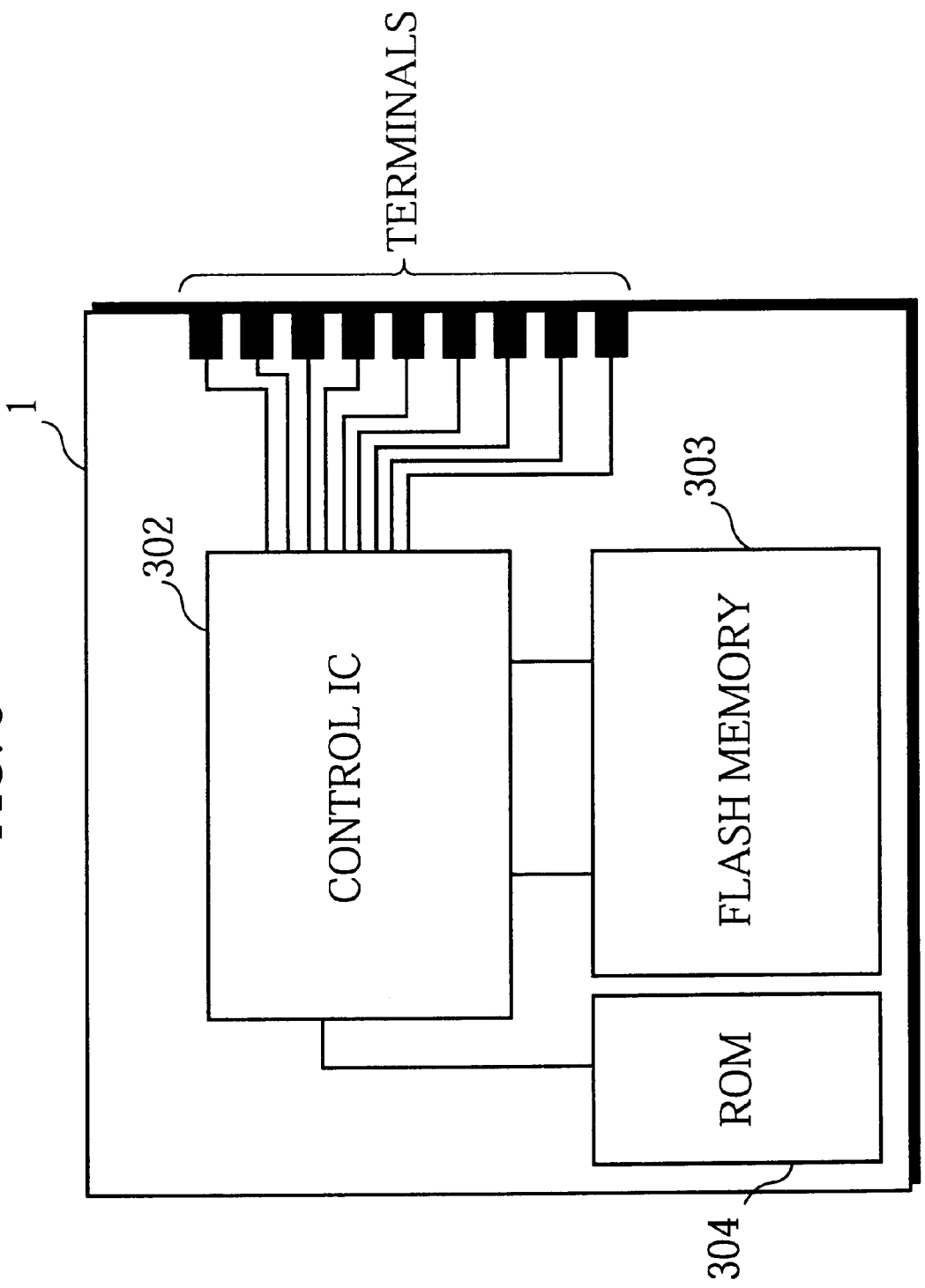
FIG. 3 is a block diagram showing the construction of the media card 1.

FIG. 3 is a block diagram showing the construction of the media card 1. As shown in FIG. 3, the media card 1 contains a control IC 302, a flash memory 303, and a ROM 304.

The control IC 302 writes/reads audio information or character information to/from the flash memory 303 or reads such information from the ROM 304 in accordance with the write command or the read command input through the terminals from a recording apparatus or a reproducing apparatus. In doing so, when the command specifies encryption, the control IC 302 encrypts the audio information when writing it, and decrypts the audio information when reading it. As understood from this, the media card 1 can also prevent unlawful copying of data which needs to be protected by copyright, by storing the data after encrypting the data.

The flash memory 303 has a sector construction. Each sector stores 512-byte digital data. For example, when the media card 1 is 64 MB-type, the storage capacity of the media card 1 is 67,188,854 (=64*1024*1024) bytes, and the number of sectors is 131,072 (=67,188,854/512). When a certain number of alternate sectors are allocated beforehand in expectation of occurrence of defect sectors, the effective storage capacity of the media card 1 excluding the alternate sectors is 65,536,000 bytes and the number of sectors is 128,000, for example.

The ROM 304 stores data that is unique to the media card 1, and the external apparatus can only read the data from the ROM 304 but cannot write data to the ROM 304.

Record Area in Physical Layer

Figure 5:
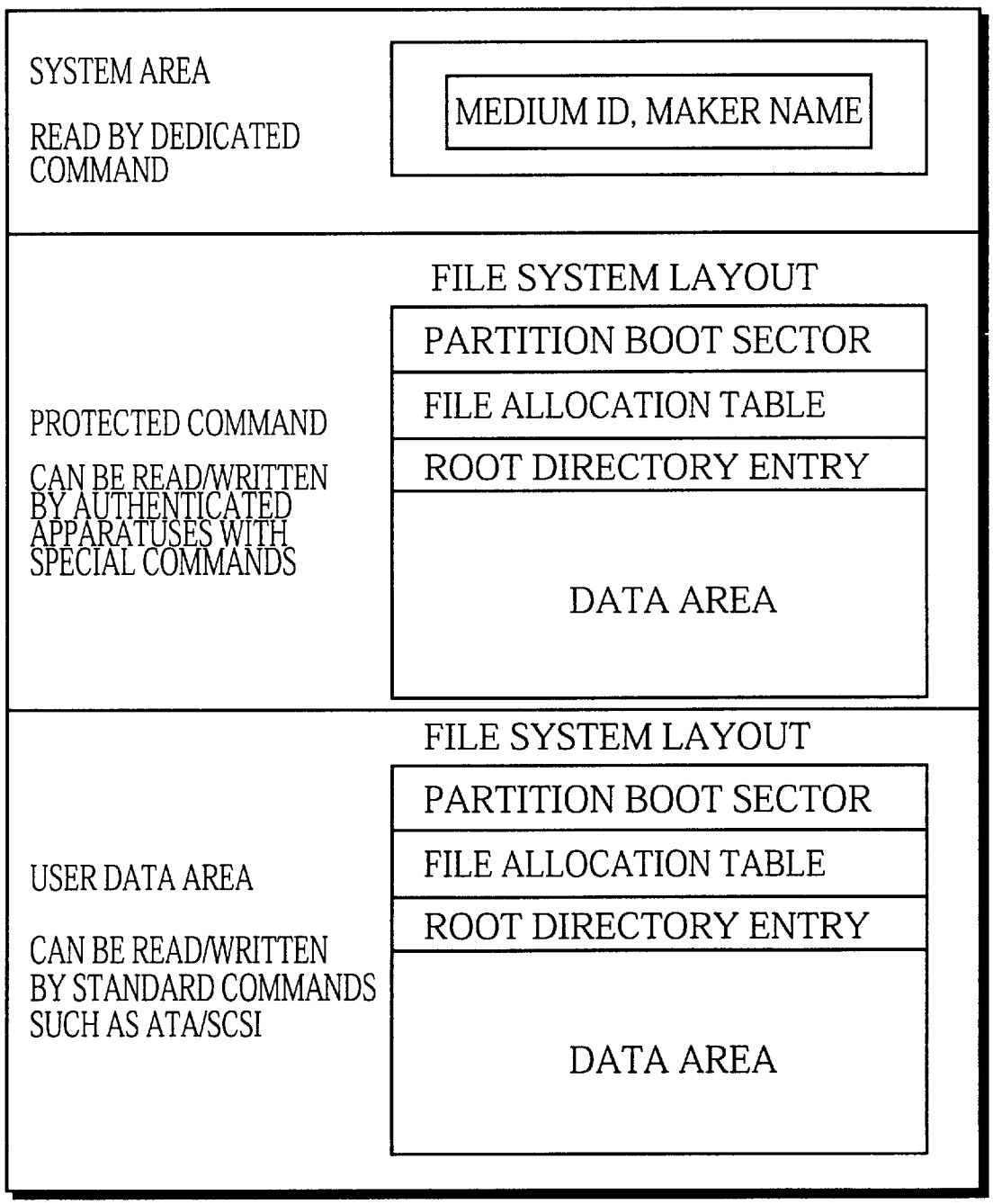
FIG. 5 shows the construction of the storage area in the media card 1.

FIG. 5 shows the construction of the storage area in the media card 1. As shown in FIG. 5, the storage area in the media card 1 is divided into a system area, a protected area, and a user data area. Of these, the system area belongs to the ROM 304 and the protected area and the user data area belong to the flash memory 303. The system area and the protected area are used for copyright protection.

The system area is a read-only area for storing information unique to the media card 1 such as a medium ID, a maker name, etc.

The protected area stores a key which, while the media card 1 is inserted into a recording apparatus or a reproducing apparatus, is written or read by the apparatus only when a mutual authentication with the apparatus has completed affirmatively, the key being required for encryption and decryption of the audio information and generated from the medium ID, a random number or the like.

The user data area stores audio information and character information which can be written or read whether the mutual authentication has completed affirmatively or not. The data which need to be protected by copyright is encrypted and then stored in user data area.

File System Layer

The file system of the media card 1 is a FAT (File Allocation Table) file system (ISO/IEC 9293), and the file system type is either FAT 12 or FAT 16. The protected area and the user data area of the media card are formatted as FAT file systems.

As shown in FIG. 5, the file system of the protected area and the user data area is composed of a partition boot sector, a file allocation table, and a root directory entry, and a data area.

The partition boot sector stores data which is read when the system is activated.

The file allocation table is either of a FAT 12 file system for the 12-bit FAT or a FAT 16 file system for the 16-bit FAT, the FAT construction conforms to the ISO/IEC 9293 standard.

The root directory entry is information showing files that exist under the root directory. The root directory entry includes, for example: file names of the files that exist under the root directory; file attributes; file update year/month/day/time; the cluster numbers of the clusters that store the first parts of the files.

The data area stores a variety of files. The data area in the user data area stores audio information files. The data area in the protected area stores key files when the audio information has been encrypted.

Application Layer

Figure 4:
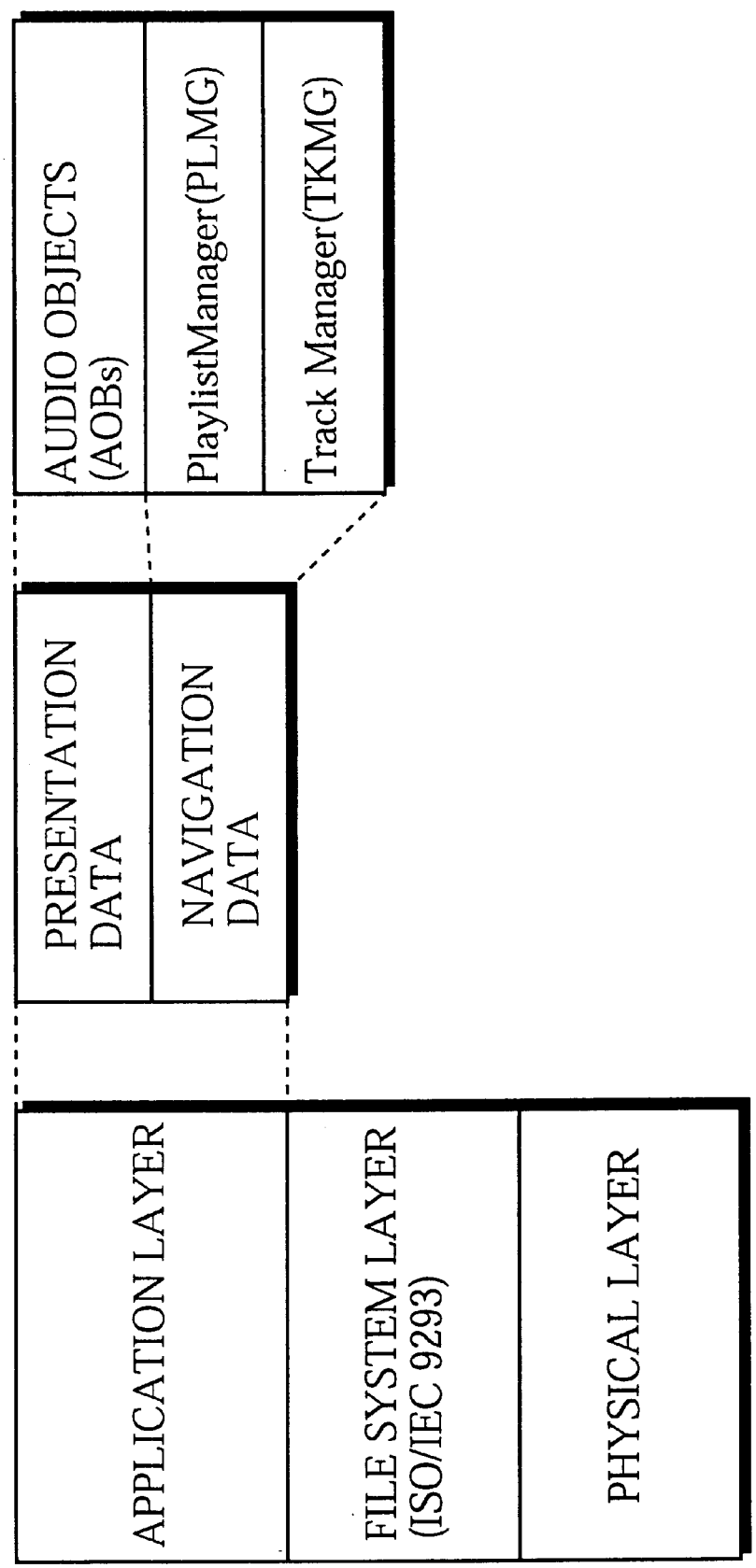
FIG. 4 shows the application layer of the media card 1.

The application layer is divided into presentation data and navigation data, as shown in FIG. 4.

Figure 6A:
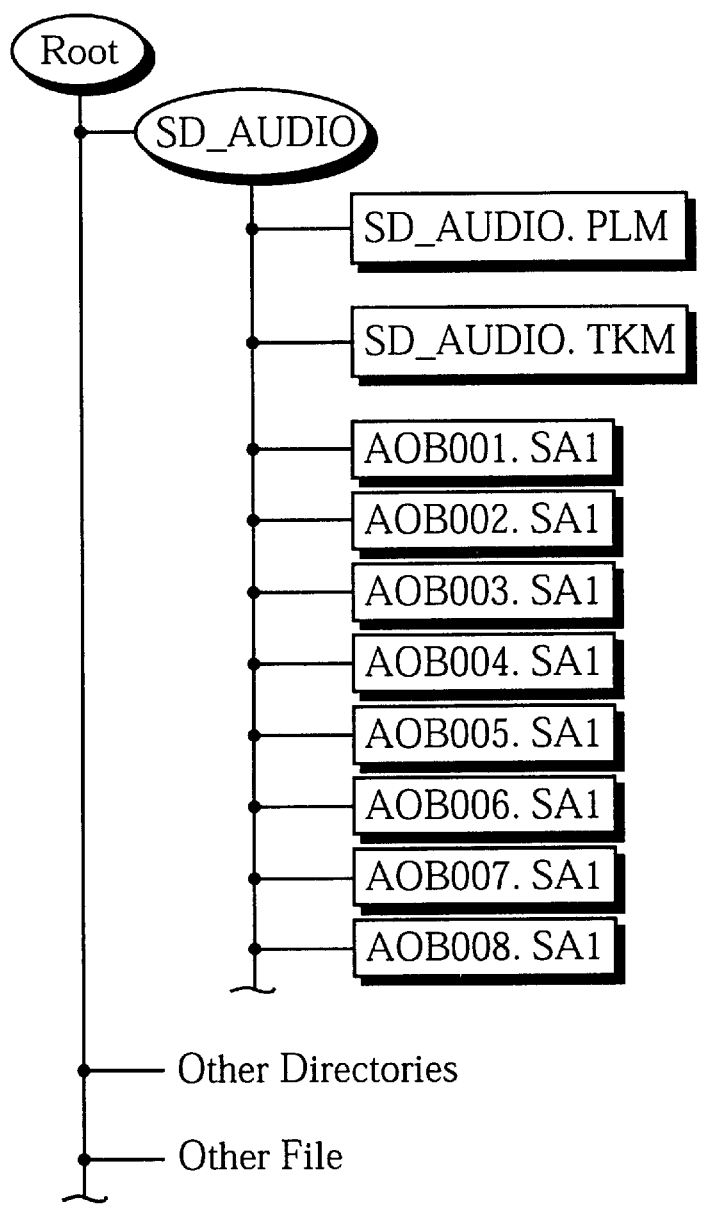
FIGS. 6A and 6B show examples of constructions of directories and files in the protected area and the user data area in the media card 1.
Figure 6B:
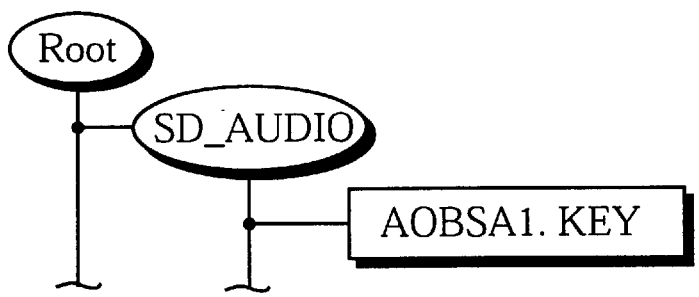

The presentation data is composed of a plurality of pieces of audio information, or a plurality of audio objects (hereinafter referred to as AOBs). Note that the AOBs are compressed audio data generated by compressing audio digital data. The AOBs conforms to MPEG2-AAC (Advanced Audio Coding), for example. MPEG2-AAC is detailed in "ISO/IEC 13818-7:1997(E) Information technology—Generic coding of moving pictures and associated audio information—Part7 Advanced Audio Coding (AAC)" and will not be described here. In the present embodiment, it is defined that one AOB corresponds to a fixed time period (approximately 8.5 minutes) for the sake of reproduction management. One piece of audio information includes either one AOB or a plurality of AOBs depending on the length of reproduction. FIG. 6A shows an example of the construction of the user data area. In this example, AOBs are stored with file names "AOB001.SA1" to "AOB008.SA1" in "SD_AUDIO" directory under the Root directory. In this example, eight AOBs are recorded in the user data area. However, the number is not limited to eight and up to 999 AOBs can be recorded in the user data area. An encrypted AOB is stored in the protected area with a file name, for example, "AOBSA1.KEY" as key information, as shown in FIG. 6B.

The navigation data includes two kinds of management data called a Playlist Manager and a track manager.

The play list manager includes one or more play lists which specify a reproduction order of a plurality of pieces of audio information. The play list is either: a default play list which specifies a reproduction order of all pieces of audio information recorded in the media card 1; and a play list which specifies an arbitrary reproduction order generated in accordance with user operations. The play list manager is stored in the user data area with a file name, for example, "SD_AUDIO.PLM", as shown in FIG. 6A.

The track manager is information used for managing audio information (i.e., AOBs). The track manager includes, for example, audio attribute information (bit rate, sampling frequency, the number of channels, etc.) of each AOB, and character information related to audio information. In the present document, the term "track" indicates one piece of audio information. More specifically, the track manager is a group of pieces of track information which each correspond to the AOBs stored in the user data area.

When a track is composed of an AOB, the track information corresponding to the AOB includes: character information corresponding to the track; and information of the AOB.

When a track is composed of a plurality of AOBs, a piece of track information corresponding to the first AOB includes: character information corresponding to the track; and information of the first AOB, and the other pieces of track information include information of the second AOB and after, respectively. The track manager is stored in the user data area with a file name, for example, "SD_AUDIO.TKM", as shown in FIG. 6A.

Figure 7:
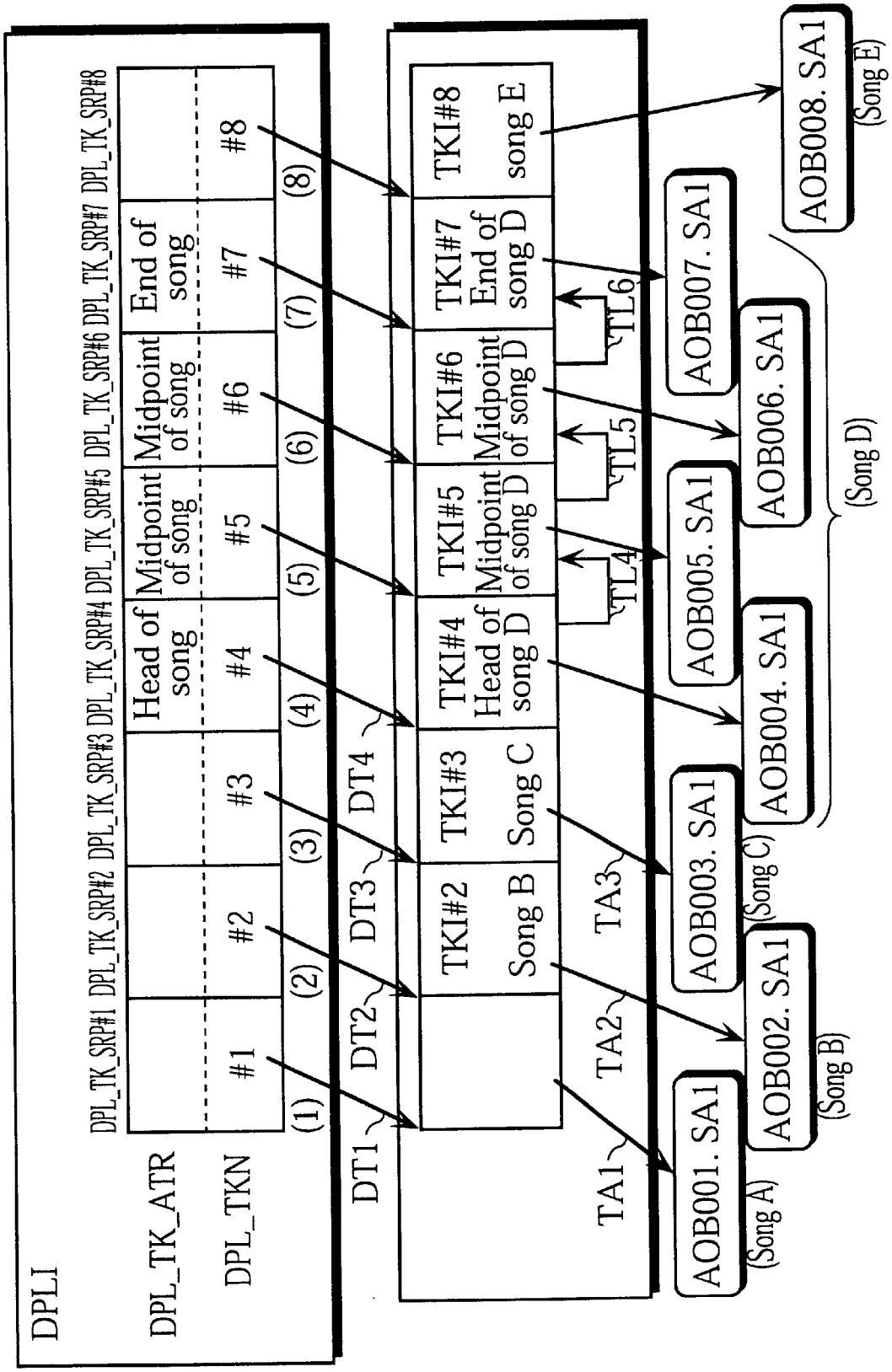
FIG. 7 shows relationships between the default play list, track manager, and AOBs.

FIG. 7 shows relationships between a default play list -n (represented as DPLI in the drawing), the track manager (represented as TKMG in the drawing), and AOBs. In FIG. 7, AOB001.SA1, AOB002.SA1, AOB003.SA1, and AOB008.SA1 respectively constitute tracks being Songs A, B, C, and E, and the four AOBs AOB004.SA1 to AOB007.SA1 constitute a track being Song D.

The track manager includes a plurality of pieces of track information (represented as TKIs in FIG. 7) which correspond to the AOBs AOB001.SA1 to AOB008.SA1 on one-to-one basis. Each piece of track information includes: a serial number (hereinafter referred to as track information number) uniquely assigned to the piece of track information which is in the semiconductor memory card; a link pointer which indicates the next piece of track information when the AOB corresponding to the piece of track information is one of a plurality of AOBs constituting the track; and character information composed of the first and second data as described earlier. In FIG. 7, the track manager includes track information TKI#1 to TKI#8 corresponding to AOB001.SA1 to AOB008.SA1, respectively. Of these, AOB004.SA1 to AOB007.SA1, which constitute a track, are related to each other by the link pointers.

The default play list specifies a reproduction order of the tracks (Songs A, B, C, D and E in FIG. 7) by arranged track search pointers which respectively correspond to the plurality of pieces of track information. Each track search pointer includes a track information number uniquely assigned to a piece of track information, thus indicates the piece of track information by the track information number.

In FIG. 7, the default play list is composed of eight track search pointers #1 to #8 which are arranged in the order of track information numbers #1 to #8. Accordingly, the default play list specifies a reproduction order of Songs A, B, C, D, and E in this order since TKIs #1 to #8 respectively included in the track search pointers #1 to #8 are arranged in this order.

Note that the track search pointers #5 to #7 among #4 to #7 corresponding to Song D may not include the track information numbers since track information #4 to #7 are related to each other by the link pointers.

Note also that though not shown in the drawings, the data structure of the play list which specifies an arbitrary reproduction order generated in accordance with user operations is the same as that of the default play list. Since each play list is composed of a plurality of track search pointers which each include only a track information number, editing the play list, including addition and deletion of the track search pointers is easy.

Details of Track Manager

Figure 8:
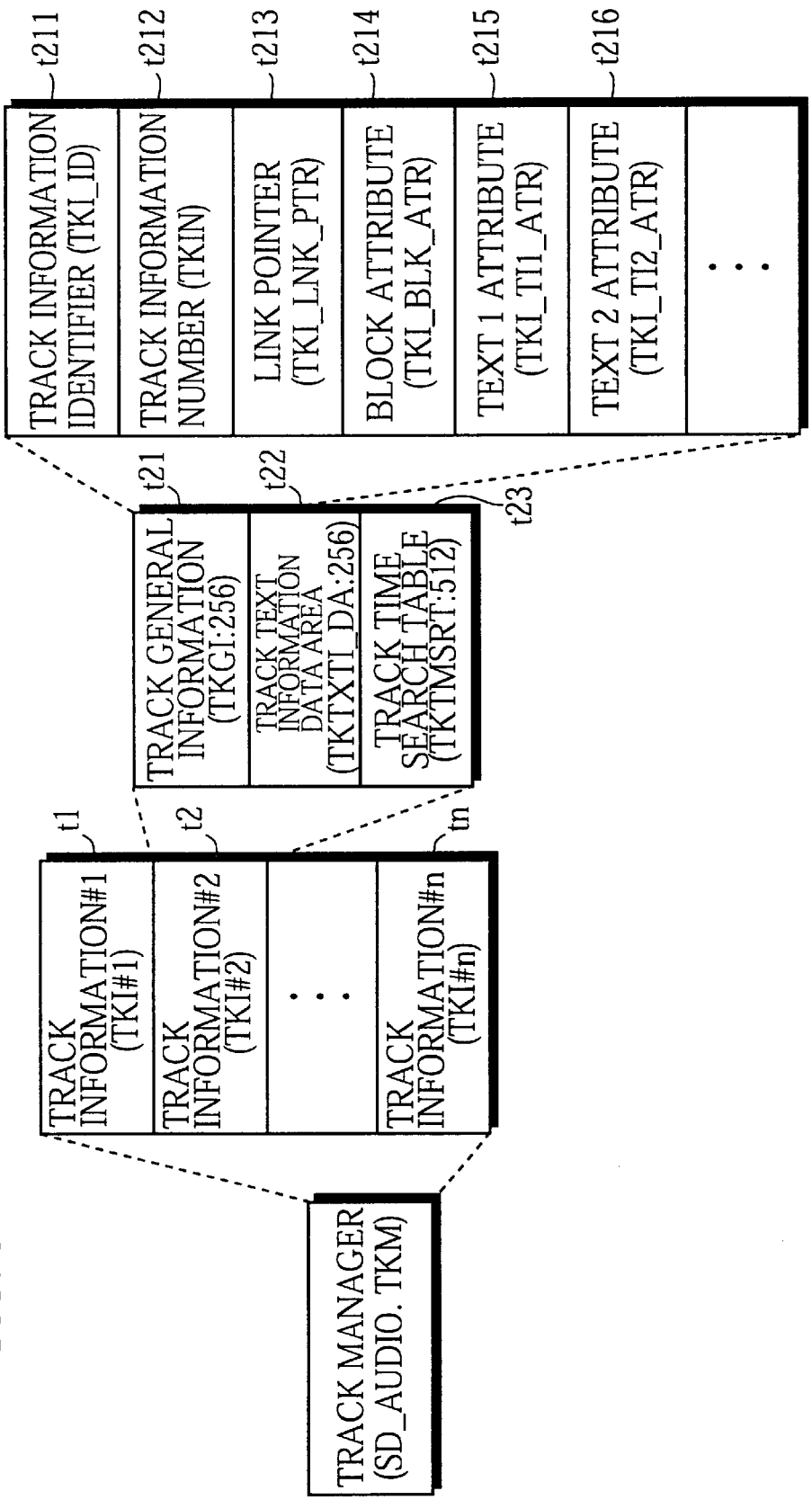
FIG. 8 is a block diagram showing a detailed data structure of the track manager.

FIG. 8 shows a detailed data structure of the track manager. As shown in FIG. 8, the track manager (represented as SD AUDIO.TKM in FIG. 6) is composed of a plurality of pieces of track information #1 to #n (t1 to tn), the track information #1 to #n being also referred to as TKI #1 to TKI #n.

Each piece of track information has the same data structure. Here, track information #2 t2 will be used for explaining the data structure of the track information. The track information #2 t2 has a fixed length of 1,024 bytes in the present embodiment, and is composed of track general information (also referred to as TKGI) t21 of 256 bytes, character information (TKTXTI_DA) t22 of 256 bytes, and a track time search table (TKTMSRT) t23 of 512 bytes. The reason why the track information #2 t2 has a fixed length of 1,024 bytes is that each piece of track information is stored in two sectors and the time search table in the track information is stored in one sector of the two sectors. With this construction, the track information is read or written by accessing a set of two consecutive sectors, where the sector is the minimum unit of access. This increases the speed of accessing the track information.

The track general information t21 includes track information identifier (TKI_ID) t211, track information number (TKIN) t212, link pointer (TKI_LNK_PTR) t213, block attribute (TKI_BLK_ATR) t214, text 1 attribute (TKI_TI1_ATR) t215, and text 2 attribute (TKI_TI2_ATR) t216.

The track information identifier t211 is common to all pieces of track information and is an identifier of the track information.

The track information number t212 is a serial number uniquely assigned to the track information, as described earlier. A track information number is one of values 1 to 999.

The link pointer t213 indicates the next piece of track information (by the track information number) when the AOB corresponding to the piece of track information containing the link pointer is one of a plurality of AOBs constituting the track, as described earlier. Otherwise, the link pointer t213 has invalid data (e.g., 0).

The block attribute t214 indicates that (i) the track is composed of one AOB and the current track information corresponds to the only AOB constituting the track, or (ii) the current track information is the head, midpoint, or end of the track when the track is composed of a plurality of AOBs. For example, when the block attribute has a value "000 (binary)", it indicates that the current track information corresponds to the AOB that is the only AOB constituting the track; a value "001" indicates that the current track information corresponds to the head AOB when the track is composed of a plurality of AOBs; a value "010" indicates that the current track information corresponds to the midpoint AOB; and a value "011" indicates that the current track information corresponds to the end AOB.

The text 1 attribute t215 indicates the type of the first data, or a 1-byte character code sequence that can be recorded in the character information t22. FIG. 9A shows specific examples of the text 1 attribute t215. In FIG. 9A, a value "00h(hex)" of the text 1 attribute indicates that no 1-byte character code sequence recorded in the character information t22. Values "01h" to "03h" of the text 1 attribute respectively indicate that 1-byte character code sequences conforming to ISO646, JISX0201, and ISO8859-1 are recorded in the character information t22. Here, ISO646 defines ASCII codes for alphanumerics and signs, JISX0201 defines hankaku katakana in addition to ASCII codes, and ISO8859-1 defines Latin alphabets in addition to ASCII codes.

The text 2 attribute t216 indicates the type of the second data, or a 2-byte character code sequence that can be recorded in the character information t22. FIG. 9B shows specific examples of the text 2 attribute t216. In FIG. 9B, a value "00h(hex)" of the text 2 attribute indicates that no 2-byte character code sequence is recorded in the character information t22. A value "81 h" indicates that a 2-byte character code sequence conforming to "Music Shift JIS KANJI" (Recording Industry Association of Japan) is recorded in the character information t22. The character information t22 is composed of the first data 10 and the second data.

The track time search table is used for fast forward reproduction and fast rewinding reproduction, and stores addresses of AOBs which are reproduced at intervals of approximately two seconds.

Details of Character Information

Figure 10:
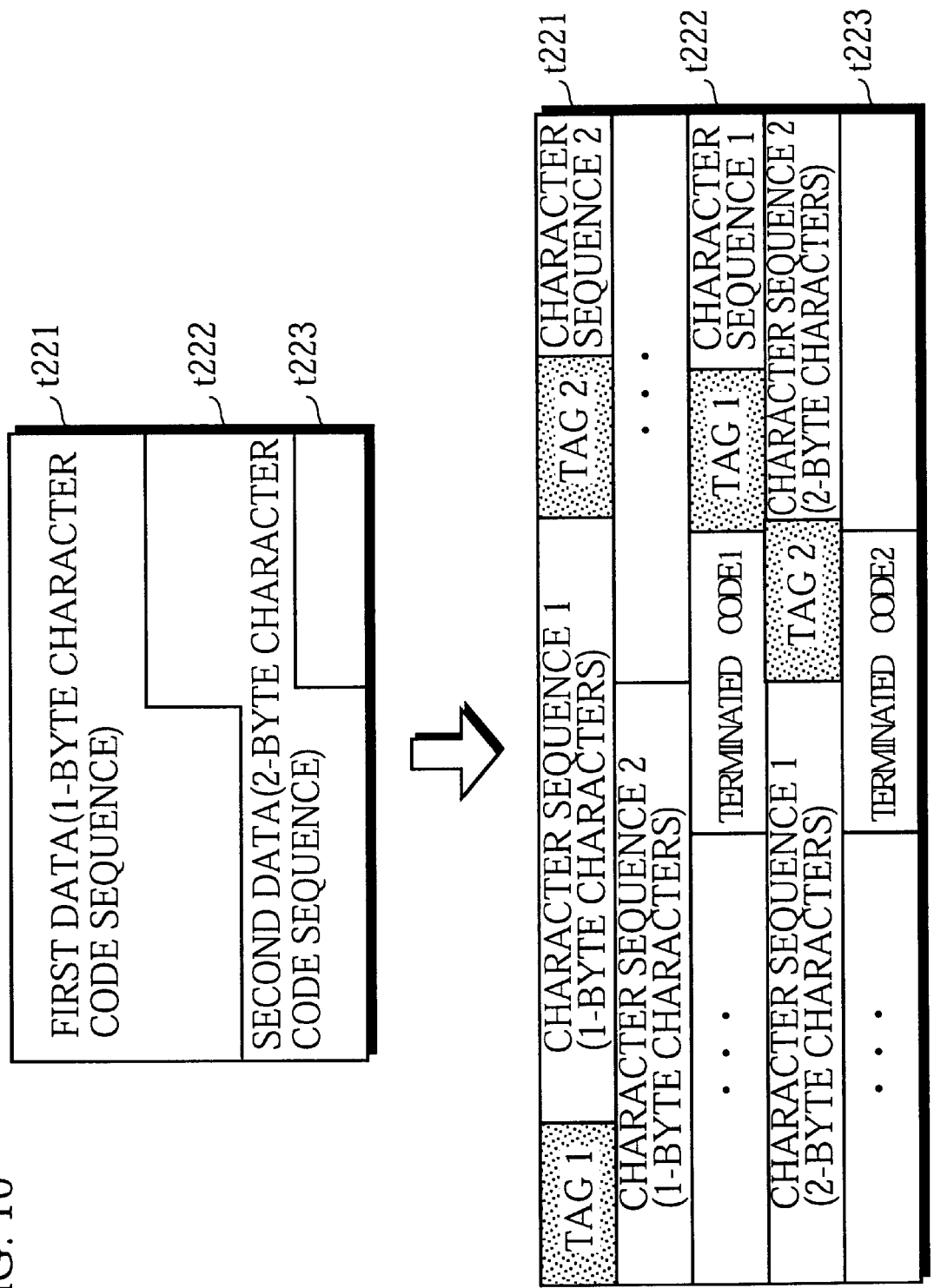
FIG. 10 shows the storage area for character information.

FIG. 10 shows the storage area for the character information (TKTXTI_DA) t22 shown in FIG. 8.

The storage area for storing the character information (TKTXTI_DA) t22 is a half of a sector (512 bytes) and has a fixed size of 256 bytes, the other half being used for storing the track general information t21. As shown in the upper portion of FIG. 10, the character information (TKTXTI_DA) is composed of the first data t221, the second data t222, and a free area t223. The free area t223 is generated when the total size of the first data t221 and the second data t222, both being variable-length, does not reach 256 bytes.

As shown in the lower portion of FIG. 10, the first data t221 is composed of flags and 1-byte character code sequences arranged alternately. The flags are called tags and indicate the types of items. The 1-byte character code sequences indicate contents of the items. A terminated code "00h" is attached to the end of the first data. A terminated code "0000h" is attached to the end of the second data.

FIG. 11 shows the types of the tags.

As shown in FIG. 11, the tags for the first data are 1-byte. That is, the tag indicating the title is "01h", the artist "02h", the album title "03h", the lyricist "04h", the composer "05h", the arranger "06h", the producer "07h", the record company "08h", the artist's message "09h", the user's comment "0Ah", the provider's comment "0Bh", the date (year, month, and day) "0Ch", the genre "0Dh", the URL (Uniform Resource Locator) "0Eh", the free item (an item the user can set) 1 "0Fh", the free item 2 "10h", the free item 3 "11h", the free item 4 "12h", the free item 5 "13h", and the free item 6 "14h".

The tags for the second data are 2-byte codes which are made by attaching "00h" to the upper portion of each tag for the first data.

As understood from above description, the character information (TKTXTI_DA) t22 includes the first data and the second data, where both first data and second data represent the same contents. As a result, reproducing apparatuses which can reproduce only 1-byte character codes display hankaku character code sequences being 1-byte character codes represented by the first data, and reproducing apparatuses which can also reproduce 2-byte character codes display 2-byte character codes including alphanumerics, hiragana, and Chinese characters represented by the second data.

Construction of Reproducing Apparatus

Figure 12:
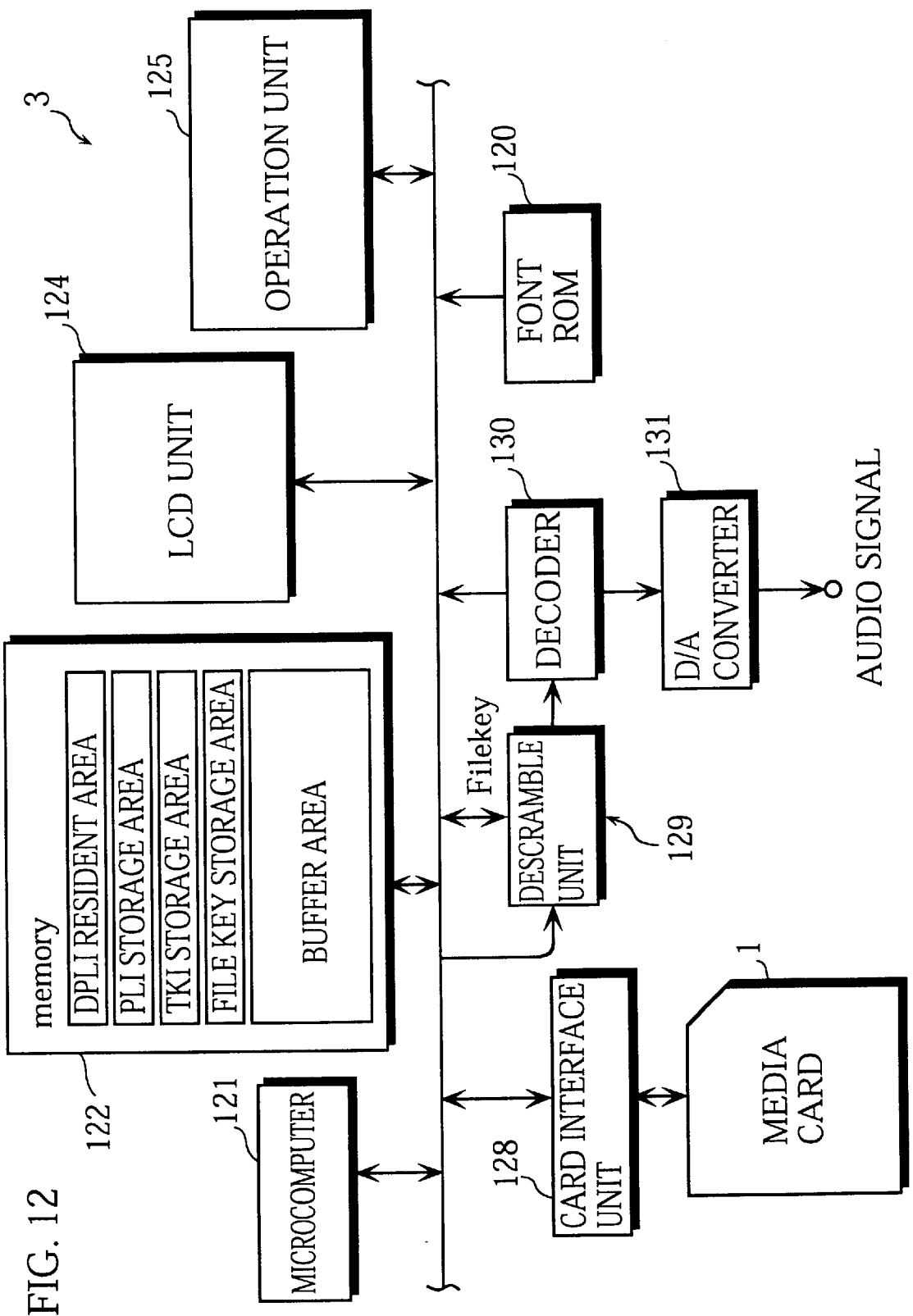
FIG. 12 is a block diagram showing the construction of a reproducing apparatus.

FIG. 12 is a block diagram showing the construction of the reproducing apparatus 3 shown in FIG. 1. The reproducing apparatus 3 includes a font ROM 120, a microcomputer 121, a memory 122, an LCD unit 124, an operation unit 125, a card interface unit 128, a descramble unit 129, a decoder 130, and a D/A converter 131.

The font ROM 120 is classified into three types and one of the three types is selected depending on the type of the reproducing apparatus. The first type font ROM 120 stores only the font data corresponding to 1-byte character codes. The second type font ROM 120 stores only the font data corresponding to 2-byte character codes. The third type font ROM 120 stores the font data corresponding to both 1-byte and 2-byte character codes. The font data corresponding to 1-byte character codes conforms to at least one of ISO646, JISX0201, and ISO8859-1. The font data corresponding to 2-byte character codes conforms to, for example, "Music Shift JIS KANJI".

The microcomputer 121 contains a ROM or a RAM, and controls all operations of the reproducing apparatus, such as reproducing audio information and displaying character information on the LCD unit 124, by executing a program stored in the ROM. The program for displaying character information operates differently depending on the type of the font ROM 120. That is to say, the microcomputer 121 reads the first data (a 1-byte character code sequence) out of the character information and controls displaying of the read data on the LCD unit 124 based on the font data when the ROM 120 is the first type; the microcomputer 121 reads the second data (a 2-byte character code sequence) out of the character information and controls displaying of the read data on the LCD unit 124 when the ROM 120 is the second type; and the microcomputer 121 reads selectively the first data or the second data based on, for example, user settings when the ROM 120 is the third type.

The memory 122 is a work memory for temporarily storing the audio information, character information, etc. read out from the media card 1 when the audio information is reproduced. As shown in FIG. 12, the memory 122 includes a DPLI resident area, a PLI storage area, a TKI storage area, a file key storage area, and a buffer area. The DPLI resident area stores the default play list as resident data. The PLI storage area stores a currently used play list. The TKI storage area stores currently used track information. The file key storage area stores an encryption key which is used to decrypt the encryption of currently reproduced audio information (AOB). The buffer area is used as a work area or a buffer.

The LCD unit 124 is a liquid crystal display panel for displaying character information or the like. Note that when the reproducing apparatus is a portable type, the LCD unit 124 is as large as displaying a row of 12 zenkaku characters or two rows of 12 hankaku characters; and when the reproducing apparatus is a car-mounted type, the LCD unit 124 is as large as displaying several rows of 24 zenkaku characters or as large as 320×240 pixels or 640×480 pixels.

The operation unit 125 includes a reproduction key, a stop key, a pause key, a fast forward key, a fast rewinding key, and a volume key and receives user operations.

The card interface unit 128 is a slot into/from which the media card 1 is inserted/removed, and includes a group of terminals which are electrically connected to the terminals of the inserted media card 1.

The descramble unit 129 is a descrambler for decrypting audio information using the encryption key. That is to say, for reproduction, the descramble unit 129 receives encrypted audio information from the media card 1 and decrypts (descrambles) the received audio information. Here, for reproduction, the encryption key is read from the protected area in the media card 1 when the mutual authentication between the media card 1 and the reproducing apparatus 3 has completed affirmatively.

The decoder 130 receives descrambled audio information from the descramble unit 129 or receives not-encrypted audio information from the media card 1 via the memory 122, and decodes the received audio information into digital audio data.

The D/A converter 131 converts digital audio information into analog audio signals.

Operation of Reproducing apparatus

The operation of the above-constructed reproducing apparatus 3 will be described for each case where the font ROM 120 is (1) the first type, (2) the second type, or (3) the third type. It is presumed here that the media card 1 currently stores the audio information from Songs A to E as shown in FIG. 7, the default play list, and the track manager.

(1) First Type Font ROM

The microcomputer 121 reads the default play list from the media card 1 and stores the read default play list in the DPLI resident area of the memory 122 immediately after the reproducing apparatus 3 is powered on. When the reproducing apparatus 3 further receives a reproduction instruction input by the user, the microcomputer 121 reads track information #1 from the media card 1 in accordance with track search pointer #1 placed first in the default play list, and stores the read track information #1 in TKI storage area in the memory 122. The microcomputer 121 transfers the AOB (AOB001.SA1) corresponding to track information #1 (TKI#1) to the descramble unit 129 or the decoder 130 via the memory 122, one by one. The transferred audio information is converted to an analog audio signal by passing through the descramble unit 129 (only when the audio information has been encrypted), the decoder 130, and the D/A converter 131 in sequence.

As the audio information starts being transferred, the microcomputer 121 reads the character information ranging from the start to the terminated code (00h) of the 1-byte character code from the track information stored in the memory 122, reads the font data corresponding to the 1-byte character code from the font ROM 120, and sequentially supplies the font data to the LCD unit 124 so that the characters are displayed on the LCD unit 124 to be scrolled horizontally, for example.

FIG. 13 shows a specific example of characters displayed on the LCD unit 124 while the audio information is being reproduced, where the LCD unit 124 is attached to a portable reproducing apparatus and is approximately as large as 24 hankaku characters×2 rows. Note that the number of characters changes depending on the type of the character font (e.g., a proportional font, or a monospaced font).

In FIG. 13, the reproduction elapse time of the currently reproduced track is displayed on the upper portion of the display screen, and on the lower portion, the title, the artist, and the album title contained in the 1-byte character code sequence are repeatedly displayed, the characters being scrolled horizontally. A mark is uniquely attached to each of the title, the artist, and the album title (★, ☆, and ◆, respectively), and a delimiter mark (→) is also attached to each of them.

FIG. 14 shows a specific example of a play list displayed on the LCD unit 124 attached to a portable reproducing apparatus. In FIG. 14, a character sequence "playlist" is displayed on the upper portion of the display screen to show that the play list is being displayed. On the lower portion of the screen, the titles contained in the 1-byte character code sequence are repeatedly displayed, the characters being scrolled horizontally. A mark (★) unique to the titles and the delimiter mark (→) are also attached to each of the titles.

The above marks are displayed with the following construction. A table showing the correspondence between the items shown in FIG. 11 and the marks on a one-to-one basis is stored in a memory contained by the microcomputer 121. The microcomputer 121 controls the displays shown in FIGS. 13 and 14 by referring to the table.

FIG. 15 shows a specific example of characters displayed on the LCD unit 124 while the audio information is being reproduced, where the LCD unit 124 is attached to a car-mounted type reproducing apparatus and is approximately as large as 48 hankaku characters×4 rows. In FIG. 15, in the fourth row from top, the items contained in the 1-byte character code corresponding to the audio information currently reproduced are repeatedly displayed, the characters being scrolled horizontally. mark unique to each of the items (★, ☆, ○, ◎, ■, △, ▽, and #) and the delimiter mark (→) are also attached to each of the items.

(2) Second Type Font ROM

The operation of reproducing audio information is the same as the first type and will not be described here.

At the same time the microcomputer 121 starts transferring the audio information, the microcomputer 121 reads the character information ranging from the start to the terminated code (0000h) of the 2-byte character code from the track information stored in the memory 122 by skipping the start to the terminated code (00h) of the 1-byte character code, reads the font data corresponding to the 2-byte character code from the font ROM 120, and sequentially supplies the font data to the LCD unit 124 so that the characters are displayed on the LCD unit 124 to be scrolled horizontally, for example.

FIG. 16 shows a specific example of characters displayed on the LCD unit 124 while the audio information is being reproduced, where the LCD unit 124 is attached to a portable reproducing apparatus and is as large as 12 zenkaku characters×2 rows.

In FIG. 17, the reproduction elapse time of the currently reproduced track is displayed on the upper portion of the display screen, and on the lower portion, the title, the artist, and the album title contained in the 2-byte character code are repeatedly displayed, the characters being scrolled horizontally. A mark is uniquely attached to each of the title, the artist, and the album title (★, ☆, and ♦, respectively), and a delimiter mark (→) is also attached to each of them.

FIG. 17 shows a specific example of a play list displayed on the LCD unit 124 attached to a portable reproducing apparatus. In FIG. 17, a character sequence "PLAY LIST" is displayed on the upper portion of the display screen to show that the play list is being displayed. On the lower portion of the screen, the titles contained in the 2-byte character code sequence are repeatedly displayed, the characters being scrolled horizontally. A mark (★) unique to the titles and the delimiter mark (→) are also attached to each of the titles.

The above marks are displayed with the following construction. A table showing the correspondence between the items shown in FIG. 11 and the marks on a one-to-one basis is stored in a memory contained by the microcomputer 121. The microcomputer 121 controls the displays shown in FIGS. 16 and 17 by referring to 20 the table.

FIG. 18 shows a specific example of characters displayed on the LCD unit 124 while the audio information is being reproduced, where the LCD unit 124 is attached to a car-mounted type reproducing apparatus and is as large as 24 zenkaku characters×4 rows.

In FIG. 18, in the fourth row from top, the items contained in the 2-byte character code corresponding to the audio information currently reproduced are repeatedly displayed, the characters being scrolled horizontally. A mark unique to each of the items (★, ☆, ○, ⊙, ■, ▢, △, ▽, and #) and the delimiter mark (→) are also attached to each of the items.

(3) Third Type Font ROM

When the font ROM is the third type, the user selects either the 1-byte character display or the 2-byte character display beforehand, and the microcomputer 121 stores the flag indicating the selected character display. The microcomputer 121 operates the same as the first type when the flag indicates the 1-byte character display, and operates the same as the second type when the flag indicates the 2-byte character display.

Detailed Display Process

Figure 19:
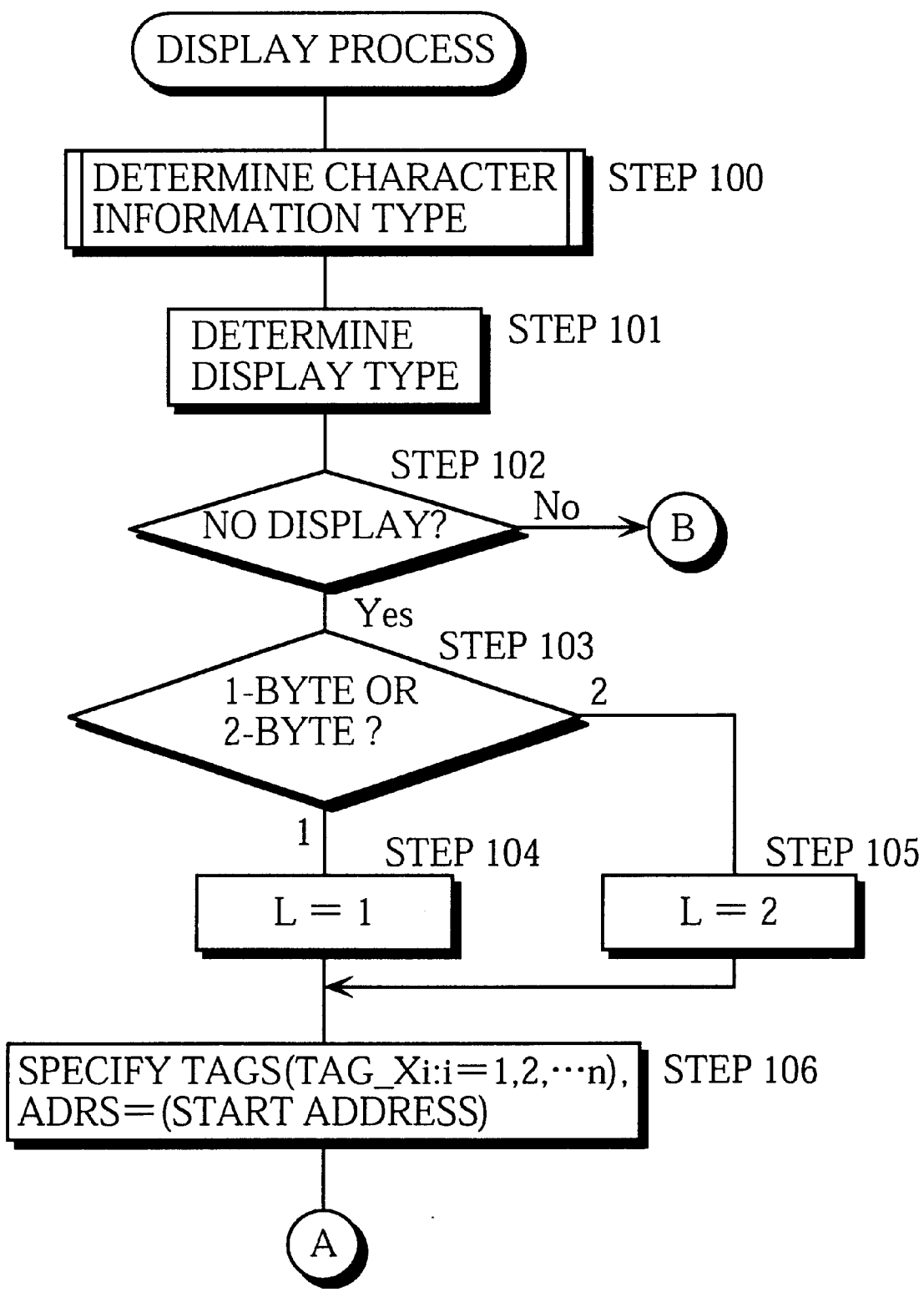
FIG. 19 is a flowchart showing the display process performed by the reproducing apparatus 3.
Figure 20:
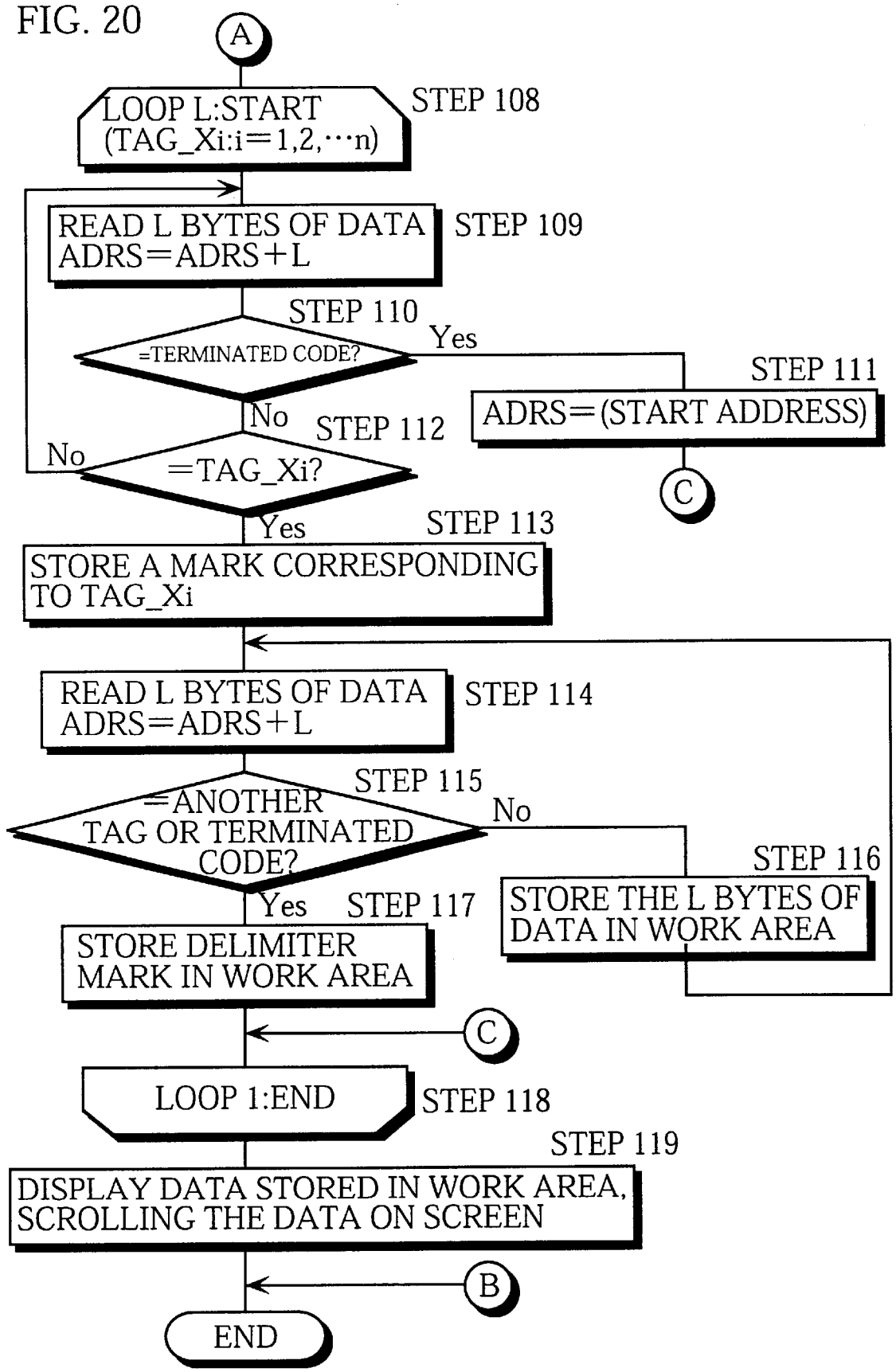
FIG. 20 is a flowchart showing the display process performed by the reproducing apparatus 3.
Figure 23A:
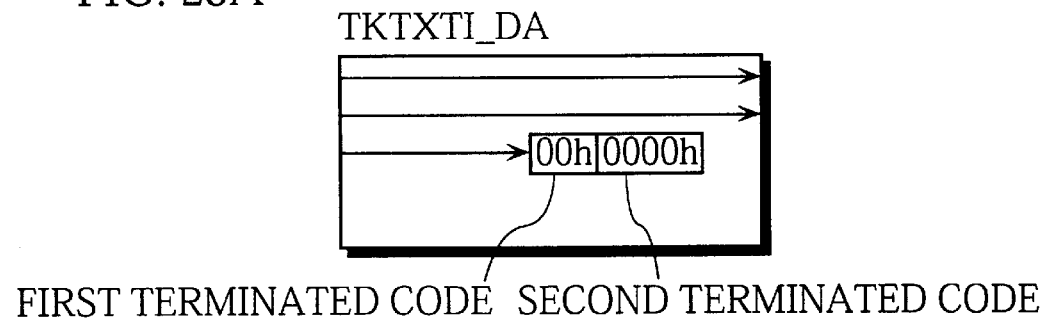
FIGS. 23A to 23D show storage positions of the first and second terminated codes.
Figure 23B:
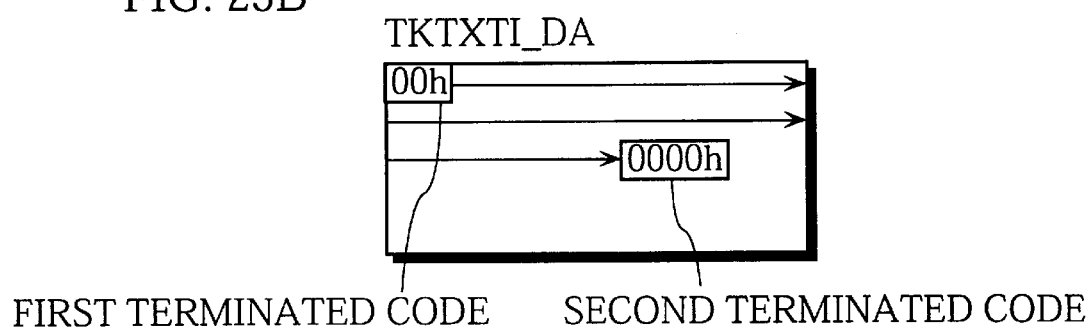
Figure 23C:
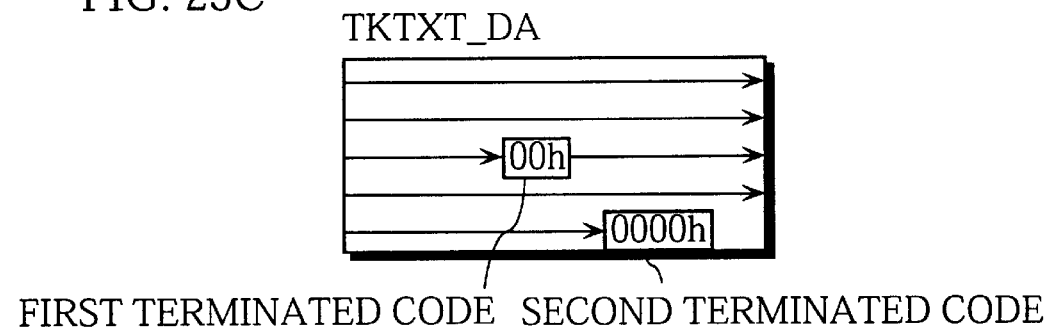
Figure 23D:
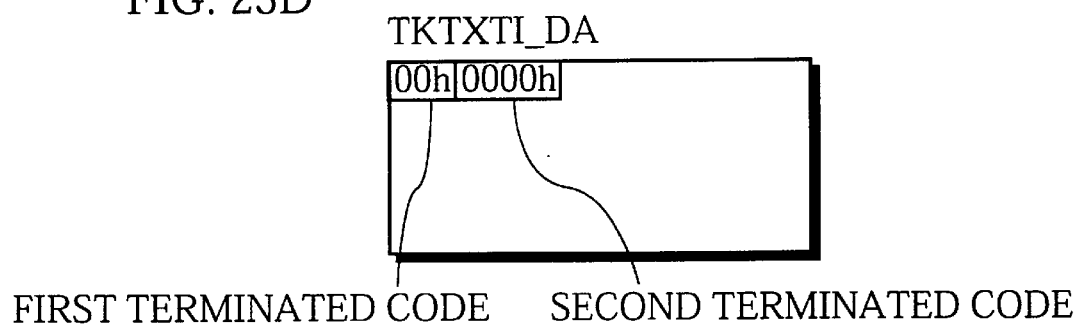

FIGS. 19 and 20 are flowcharts showing the display process performed by the reproducing apparatus 3. In these figures, it is supposed that the reproducing apparatus 3 contains a third type font ROM, and performs a display process to achieve the display examples shown in FIGS. 15 and 18.

In FIG. 19, the microcomputer 121 in the reproducing apparatus 3 determines the type of the character information (TKTXTI_DA) (step 101). There are four types as follows. Type (a): the character information contains a 1-byte character code sequence and not a 2-byte character code sequence. Type (b): the character information contains a 2-byte character code sequence and not a 1-byte character code sequence. Type (c): the character information contains both a 1-byte character code sequence and a 2-byte character code sequence. Type (d): the character information contains neither a 1-byte character code sequence nor a 2-byte character code sequence.

More specifically, the microcomputer 121 reads out the text 1 attribute (TKI_TI1_ATR) and the text 2 attribute (TKI_TI2_ATR) shown in FIG. 8, and detects the type of the character information (TKTXTI_DA) from the combination of the contents of these attributes in accordance with the determination logic shown in FIG. 21. More specifically, as shown in FIG. 21, the microcomputer 121 judges the character information as: (1) type (a) when the text 1 attribute is other than "00h" and the text 2 attribute is "00h"; (2) type (b) when the text 1 attribute is "00h" and the text 2 attribute is other than "00h"; (3) type (c) when the text 1 attribute is other than "00h" and the text 2 attribute is other than "00h"; and (4) type (d) when the text 1 attribute is "00h" and the text 2 attribute is "00h".

The microcomputer 121 determines whether characters should be displayed or not, and when characters should be displayed, the microcomputer 121 determines which characters should be displayed (i.e., 1-byte or 2-byte) (step 101). This decision is made based on specification of either of 1-byte and 2-byte by the user and the determined type of the character information, and in accordance with the display type determination logic shown in FIG. 22. That is to say, as shown in FIG. 22, the microcomputer 121 determines: (1) to display 1-byte characters when the user specifies 1-byte characters and when the character information is type (a) or (c); (2) not to display characters (no display) when the user specifies 1-byte characters and when the character information is type (b) or (d); (3) to display 2-byte characters when the user specifies 2-byte characters and when the character information is type (b) or (c); and (4) not to display (no display) characters when the user specifies 2-byte characters and when the character information is type (a) or (d).

The microcomputer 121 ends the display process when having determined not to display characters (step 102). The microcomputer 121 sets variable L to 1 when having determined to display 1-byte characters, and sets variable L to 2 when having determined to display 2-byte characters (steps 103 to 105). Note that the variable L shows an amount of data to be read out from the character information per one read-out. Note also that when having determined not to display characters, the microcomputer 121 may end the display process after displaying "NO TITLE", for example.

The microcomputer 121 specifies tags (TAG_Xi:i=1, 2, . . . n) indicating the items to be displayed, in accordance with the kind of the characters, namely depending on whether they are 125 byte or 2-byte (step 106). The microcomputer 121 also sets the variable ADRS indicating a read-out address to the start address of the storage area storing the character information (TKTXTI_DA) (step 106). More specifically, when L=1, the microcomputer 121 specifies tags 01h, 02h, . . . 14h (TAG_Xi:i=1h, 2h, . . . 14h) indicating the items shown in FIG. 15; when L=2, the microcomputer 121 specifies tags 0001h, 0002h, . . . 0014h (TAG_Xi:i=1h, 2h, . . . 14h) indicating the items shown in FIG. 18.

The microcomputer 121 generates display data in the work area in loop 1 (steps 108 to 118) as follows.

The microcomputer 121 reads out L bytes of data from a location the read-out address ADRS points to, and updates the read-out address (ADRS=ADRS+L) (step 109). The microcomputer 121 then checks whether the read-out L bytes of data match any terminated code (step 110). The microcomputer 121 then checks whether the read-out L bytes of data match the tag TAG_Xi (step 112). By repeating this process, it is judged whether the tag TAG_Xi is stored in the character information storage area. When the tag TAG_Xi is stored, the storage address is detected. When the read-out L bytes of data match any terminated code, the microcomputer 121 sets the read-out address ADRS to the start address again since the tag TAG_Xi and the item corresponding to the tag are not recorded (step 111). The next tag TAG_Xi is then processed.

When the read-out L bytes of data match the tag TAG_Xi, it means that an item corresponding to the tag TAG_Xi is recorded. As a result, the microcomputer 121 stores a mark corresponding to the item into the work area (step 113). For example, mark ★ representing "title" corresponds to the tag 01h or 0001h.

The microcomputer 121 repeats reading out L bytes of data and updating the read-out address ADRS (step 114), and storing the read-out L bytes of data into the work area (step 116) until the other kind of tag or any terminated code is read out (step 115). Through the above steps, an item corresponding to the tag TAG_Xi that has matched the read-out L bytes of data is stored in the work area.

The microcomputer 121 then stores a delimiter mark (→) into the work area (step 117). With this step, display data related to one tag TAG_Xi has been stored in the work area. After this, the microcomputer 121 repeats the steps 109 to 117 for each value of the tag TAG_Xi.

After the above process in loop 1 ends, the microprocessor 121 instructs the LCD unit 124 to display the display data stored in the work area, scrolling the data on the screen (step 119). FIGS. 15 and 18 show examples of screens displayed by the LCD unit 124 when L=1 and L=2, respectively.

Figure 24:
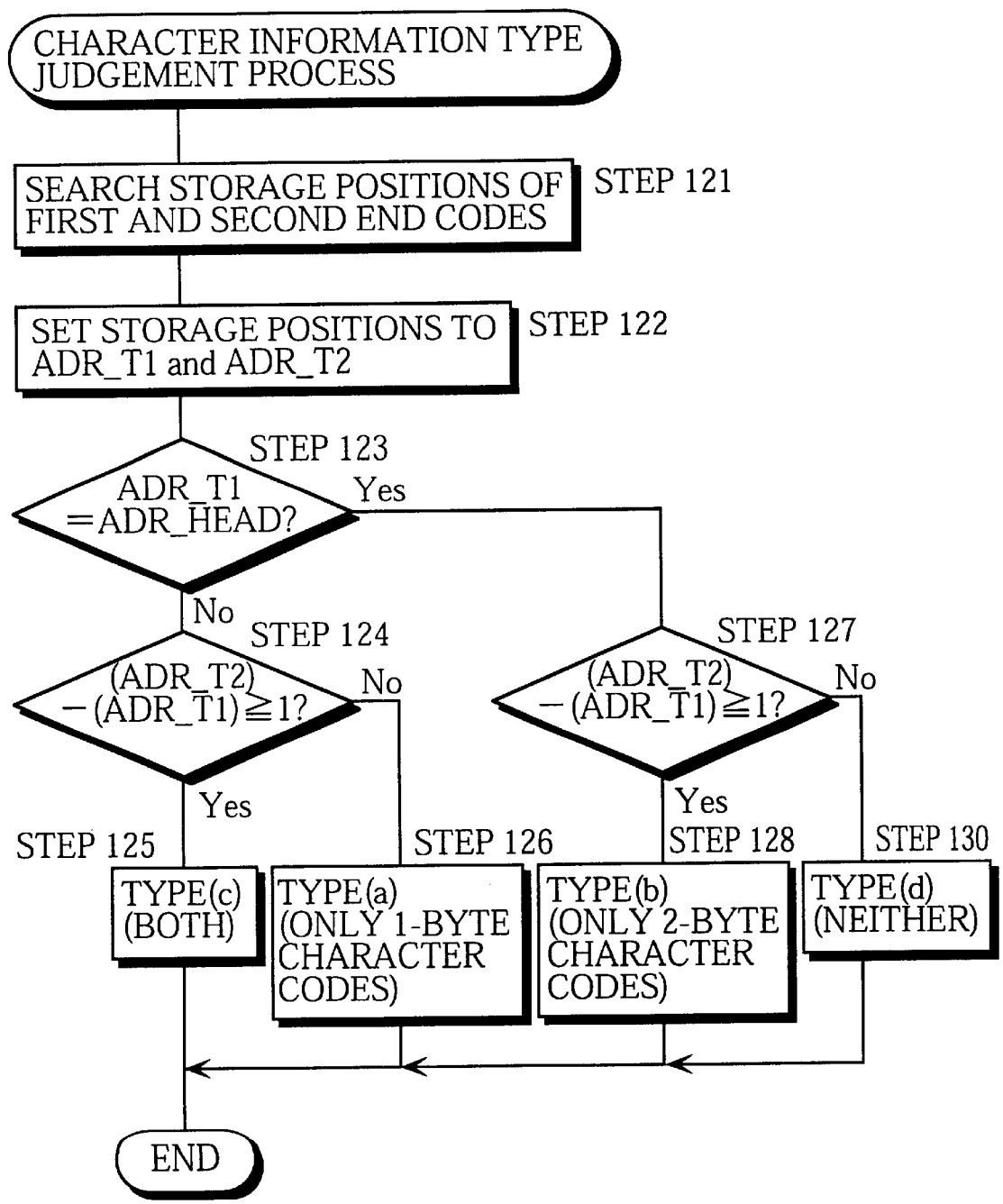
FIG. 24 is a flowchart showing the process of judging the character information type based on the storage positions of the first and second terminated codes.

Note that in step 100, the microcomputer 121 may determine the type of the character information (TKTXTI_DA) based on the storage positions of the first terminated code "00h" and the second terminated code "0000h". The storage positions are classified into four patterns shown in FIGS. 23A to 23D. FIG. 24 is a flowchart showing this kind of type judgement process. In FIG. 24, the microcomputer 121 searches the storage positions of the first and second terminated codes (step 121), and sets the addresses indicating the storage positions to ADR_T1 and ADR_T2, respectively (step 122). The microcomputer 121 checks whether ADR_T1 matches the start address of the character information storage area (step 123). The microcomputer 121 then checks whether ADR_T1 and ADR_T2 are adjacent (steps 124, 127), and determines the type of the character information (TKTXTI_DA), which is one of the types (a) to (d) (steps 125 to 130).

In FIGS. 19 and 20, it is supposed that the reproducing apparatus 3 contains a third type font ROM. For the reproducing apparatus 3 containing a first type font ROM, the flowcharts shown in FIGS. 19 and 20 may be used by modifying the flowcharts as follows: when the judgement result in step 103 is L=2, control goes to the end of the process, in the same way as the judgement result is "no display". For the reproducing apparatus 3 containing a second type font ROM, the flowcharts shown in FIGS. 19 and 20 may be used by modifying the flowcharts as follows: when the judgement result in step 103 is L=1, control goes to the end of the process, in the same way as the judgement result is "no display".

In the display type determination logic shown in FIG. 22, the microcomputer 121 determines not to display (no display) characters when the user specifies 2-byte characters and when the character information is type (a) or (d). However, when the character information is type (a) in the same condition, 1-byte characters may be displayed. In the determination logic shown in FIG. 22, the microcomputer 121 determines not to display (no display) characters when the user specifies 1-byte characters and when the character information is type (b) or (d). However, when the character information is type (b) in the same condition, 2-byte characters may be displayed. These variations are, of course, based on the premise that the font ROM prestores a font for the specified character type.

Construction of Recording/Reproducing Apparatus

Figure 25:
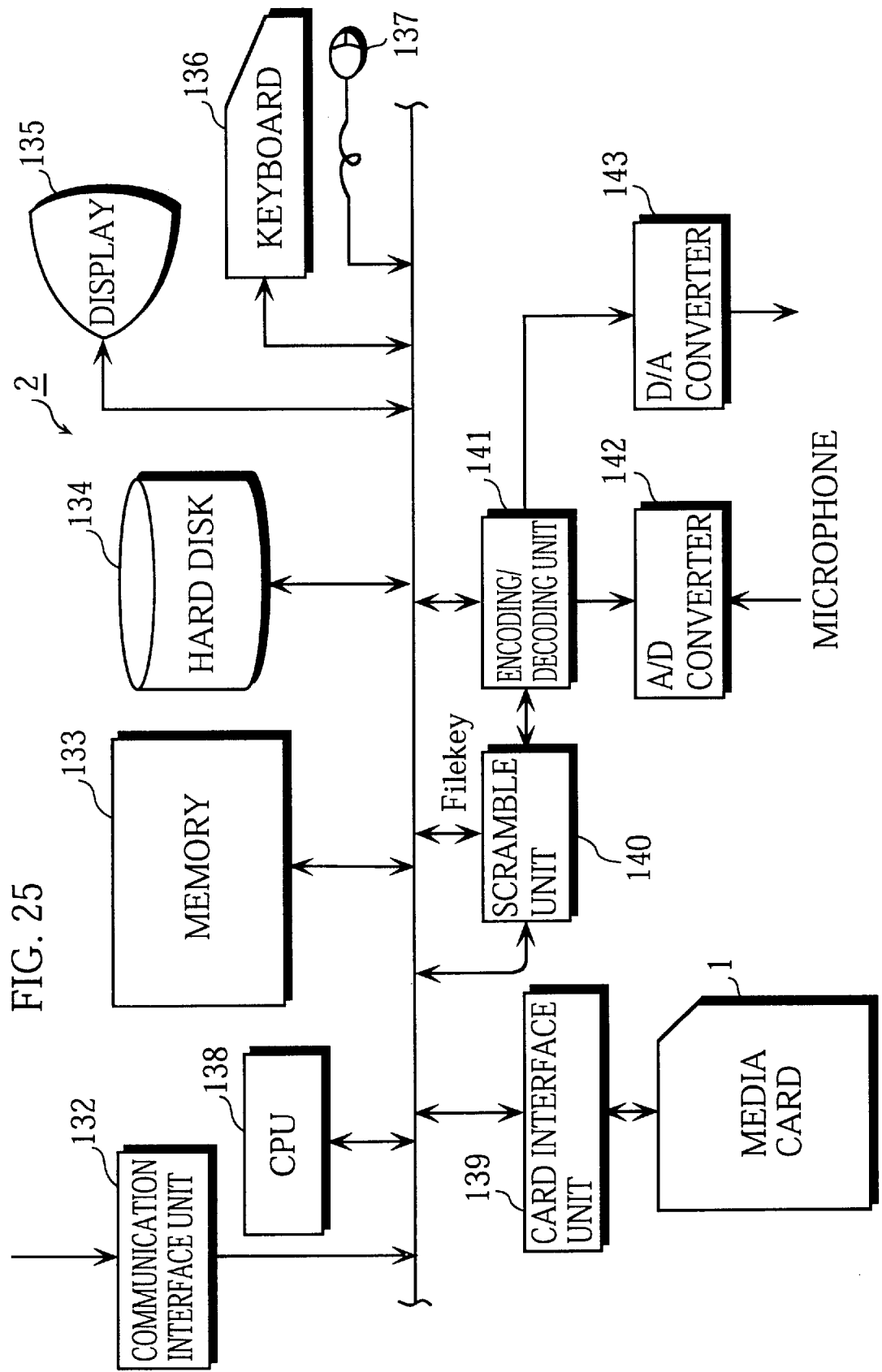
FIG. 25 is a block diagram showing the construction of the recording/reproducing apparatus 2.

FIG. 25 is a block diagram showing the construction of the recording/reproducing apparatus 2. The recording/reproducing apparatus 2 includes a communication interface unit 132, a memory 133, a hard disk 134, a display 135, a keyboard 136, a mouse 137, a CPU 138, a card interface unit 139, a scramble unit 140, an encoding/decoding unit 141, an A/D converter 142, and a D/A converter 143.

The hardware construction including the communication interface unit 132, memory 133, hard disk 134, display 135, keyboard 136, mouse 137, and CPU 138 is the same as that of typical personal computers, and will not be described here, but the construction will be described centering on the units related to the media card 1.

In FIG. 25, the communication interface unit 132 is a communication circuit such as a modem or a TA and is connected to the music provider 7 via a telephone line or the Internet.

The memory 133 stores various programs such as a program for downloading audio information and character information from the music provider 7, a program for writing/reading audio information and character information to/from the media card 1, a program for reproducing the audio information inserted into the memory 133, and a program for generating or editing audio information and character information.

The hard disk 134 stores audio information, character information, and various programs as files, where the audio information and the character information to be stored are downloaded from the music provider 7 or are newly generated.

The CPU 138 executes various programs stored in the memory 133 and controls downloading of audio information and character information from the music provider 7, recording audio information and character information onto the media card 1, reproducing audio information and character information included in the media card 1, and generating and editing audio information and character information.

The card interface unit 139 is achieved by, for example, a card slot in which a PCMCIA (Personal Computer Memory Card International Association) is inserted, where the media card 1 inserted into and/or removed from the card slot.

The scramble unit 140 is composed of a scrambler and a descrambler for encrypting and decrypting audio information using an encryption key. That is to say, the scramble unit 140, for reproduction, receives encrypted audio information from the media card 1 or the hard disk 134, and descrambles the received audio information. The scramble unit 140 also receives non-encrypted audio information from the hard disk 134 or the encoding/decoding unit 141, and scrambles the received audio information. Here, for reproduction, the encryption key is read from the protected area in the media card 1 when the mutual authentication between the media card 1 and the recording/reproducing apparatus 2 has completed affirmatively. For recording, the encryption key is downloaded from the music provider together with the audio information, and is written to the protected area in the media card 1 when the above mutual authentication has completed affirmatively.

The encoding/decoding unit 141 is composed of an encoder and a decoder for compressing and decompressing audio information. That is to say, the encoding/decoding unit 141, for reproduction, receives non-encrypted audio information from the media card 1, the scramble unit 140, or the hard disk 134, and decodes (decompresses) the received audio information and outputs audio signals via the D/A converter 143. The encoding/decoding unit 141, for generating new audio information, receives non-compressed digital audio data (such as PCM data) from the A/D converter 142 or the hard disk 134, and encodes (compresses) the audio data.

Now, the operation of the above-constructed recording/reproducing apparatus 2 will be described.

In the present description, it is presumed that the music provider 7 is a dealer who distributes contents containing audio information and character information to clients via what is called WWW server (World Wide Web) provided on the Internet.

The recording/reproducing apparatus 2 downloads data as follows. The recording/reproducing apparatus 2 receives a group of distributed AOBs from the WWW server of the music provider 7 (or a distribution service) in a certain distribution format defined by the music provider (the distribution service), and stores the received AOBs into the user data area in the media card 1 after converting the AOBs by the recording/reproducing apparatus 2 to another data format, for example, as shown in FIG. 6A. When the group of AOBs are encrypted, the recording/reproducing apparatus further downloads a key and stores it into the protected area after converting it by the recording/reproducing apparatus 2 to a data format, for example, as shown in FIG. 6B.

When downloading a group of AOBs when the music provider 7 provides the character information, the recording/reproducing apparatus 2 also downloads and stores the character information in the user data area as the character information (TKTXTI_DA) in the track information corresponding to the AOBs.

When the music provider 7 does not provide the character information, the recording/reproducing apparatus 2 generates and edits the character information in accordance with instructions input by the user, and stores it in the user data area.

As one example, the recording/reproducing apparatus 2 may display a character information generation/editing window on the screen, the window including an input box for each tag to receive character inputs from the user. Since the storage area for storing the character information (TKTXTI_DA) has a fixed length (256 bytes), the recording/reproducing apparatus 2 generates and edits the character information taking care not to exceed the fixed length, and stores it in the storage area.

When generating and editing the character information, the recording/reproducing apparatus 2 may determine the type of tag (1-byte or 2-byte) and either the first data or the second data in accordance with the type of the character codes input by the user (1-byte character codes or 2-byte character codes).

The reproduction operation of the recording/reproducing apparatus 2 is the same as that of the reproducing apparatus 3 and will not be described here.

As understood from the above description, the media card 1 of the present embodiment stores character information by showing correspondence with audio information, where the character information includes: the first data composed of a 1-byte character code sequence; and the second data composed of a 2-byte character code sequence. With this construction, it is possible for reproducing apparatuses to properly display character information whether the reproducing apparatuses have fonts for 1byte character codes or fonts for 2-byte character codes.

The area for recording character information is used efficiently due to the construction in which each of the first and second data is composed of tags and character code sequences arranged alternately, the tags indicating the types of items and the character code sequences indicating the contents of the items.

It is easy to add, delete, or edit character information in accordance with addition, deletion, or editing of audio information due to the construction in which a storage area with a size (256 bytes) less than the size of one sector is allocated to each piece of character information corresponding to a piece of audio information.

In the above embodiment, the media card 1 is inserted into the card slot of the recording/reproducing apparatus 2. However, the recording/reproducing apparatus 2 may be connected, through cables such as so called USB (Universal Serial Bus), to the reproducing apparatus 3 into which the media card 1 has been inserted so that the recording/reproducing apparatus 2 can write data to the media card 1.

The 2-byte character code sequences may include 3-byte character codes though it depends on the types of the character code.

In the above embodiment, simple marks are used as shown in FIGS. 13 to 18 for the sake of convenience. However, icons may be used instead.

The microcomputer 121 of the reproducing apparatus may identify the (a) to (c) shown below judging from the correlation between the starting position of character information in the storage area, the storage position of the terminated code "00h" of the first data, and the storage position of the terminated code "0000h" of the second data, and allow the display unit to display the character code sequence indicated by the judgement result: (a) the text information includes a 1-byte character code sequence; (b) the text information includes a 2-byte character code sequence; and (c) the text information includes a 1-byte character code sequence and a 2-byte character code sequence.

The present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor memory card for storing audio information with corresponding text information and type information, said semiconductor memory card comprising:

a text storage area;

text information which is stored in a consecutive manner from a start of said text storage area; and type information which is indicative of whether said text information is type (a), type (b), or type (c) as follows:
type (a) indicates that said text information includes a 1-byte character code sequence;
type (b) indicates that said text information includes a 2-byte character code sequence; and
type (c) indicates that said text information includes a 1-byte character code sequence and the 2-byte character code sequence;

wherein said type information is a first terminated code and a second terminated code which are included in said text information;

wherein the first terminated code is stored at the start of said text storage area when said text information stored in said text storage area does not include the 1-byte character code sequence, and the first terminated code is stored in said text storage area at the end of the 1-byte character code sequence when said text information stored in said text storage area includes the 1-byte character code sequence;

wherein the second terminated code is stored in said text storage area at a position immediately after the first terminated code when said text information stored in said text storage area does not include the 2-byte character code sequence, and the second terminated code is stored in said text storage area at the end of the 2-byte character code sequence when the text information stored in said text storage area includes the 2-byte character code sequence; and wherein a storage position of the first terminated code and a storage position of the second terminated code in said text storage area are indicative of whether said text information is type (a), type (b), or type (c).

2. A recording apparatus for storing audio information with corresponding text information and type information onto a semiconductor memory card which can be inserted into and/or removed from said recording apparatus, the semiconductor memory card including a text storage area, said recording apparatus comprising:

a first recording device operable to record audio information onto the semiconductor memory card; and a second recording device operable to record text information in a consecutive manner from a start of the text storage area and operable to record type information which is indicative of whether the text information is type (a), type (b), or type (c) as follows:
type (a) indicates that the text information includes a 1-byte character code sequence;
type (b) indicates that the text information includes a 2-byte character code sequence; and
type (c) indicates that the text information includes a 1-byte character code sequence and the 2-byte character code sequence;

wherein the type information is a first terminated code and a second terminated code which are included in the text information;

wherein the first terminated code is stored at the start of the text storage area when the text information stored in the text storage area does not include the 1-byte character code sequence, and the first terminated code is stored in the text storage area at the end of the 1-byte character code sequence when the text information stored in the text storage area includes the 1-byte character code sequence;

wherein the second terminated code is stored in the text storage area at a position immediately after the first terminated code when the text information stored in the text storage area does not include the 2-byte character code sequence, and the second terminated code is stored in the text storage area at the end of the 2-byte character code sequence when the text information stored in the text storage area includes the 2-byte character code sequence; and wherein a storage position of the first terminated code and a storage position of the second terminated code in the text storage area are indicative of whether the text information is type (a), type (b), or type (c).

3. A recording/reproducing apparatus for recording/reading audio information with corresponding text information and type information to/from a semiconductor memory card which can be inserted into and/or removed from said recording/reproducing apparatus, the semiconductor memory card including a text storage area, said recording/reproducing apparatus comprising:

a first recording device operable to record audio information onto the semiconductor memory card; and a second recording device operable to record text information in a consecutive manner from a start of the text storage area and operable to record type information which is indicative of whether the text information is type (a), type (b), or type (c) as follows:
type (a) indicates that the text information includes a 1-byte character code sequence;
type (b) indicates that the text information includes a 2-byte character code sequence; and
type (c) indicates that the text information includes a 1-byte character code sequence and the 2-byte character code sequence; and a read-out device operable to read out audio information and corresponding text information and type information from the semiconductor memory card;

wherein the type information is a first terminated code and a second terminated code which are included in the text information;

wherein the first terminated code is stored at the start of the text storage area when the text information stored in the text storage area does not include the 1-byte character code sequence, and the first terminated code is stored in the text storage area at the end of the 1-byte character code sequence when the text information stored in the text storage area includes the 1-byte character code sequence;

wherein the second terminated code is stored in the text storage area at a position immediately after the first terminated code when the text information stored in the text storage area does not include the 2-byte character code sequence, and the second terminated code is stored in the text storage area at the end of the 2-byte character code sequence when the text information stored in the text storage area includes the 2-byte character code sequence; and wherein a storage position of the first terminated code and a storage position of the second terminated code in the text storage area are indicative of whether the text information is type (a), type (b), or type (c);

a reproducing device operable to reproduce the read out audio information; and a control device operable to control a display unit to display either the 1-byte character code sequence or a 2-byte character code sequence in accordance with the read out type information.

4. A reproducing apparatus for reading out audio information with corresponding text information and type information from a semiconductor memory card which can be inserted into and/or removed from said reproducing apparatus, the semiconductor memory card including a text storage area, said reproducing apparatus comprising:

a read-out device operable to read out audio information and corresponding text information and type information from the semiconductor memory card;

wherein the text information is stored in a consecutive manner from a start of the text storage area and the type information is indicative of whether the text information is type (a), type (b), or type (c) as follows:

type (a) indicates that the text information includes a 1-byte character code sequence;

type (b) indicates that the text information includes a 2-byte character code sequence; and type (c) indicates that the text information includes a 1-byte character code sequence and the 2-byte character code sequence;

wherein the type information is a first terminated code and a second terminated code which are included in the text information;

wherein the first terminated code is stored at the start of the text storage area when the text information stored in the text storage area does not include the 1-byte character code sequence, and the first terminated code is stored in the text storage area at the end of the 1-byte character code sequence when the text information stored in the text storage area includes the 1-byte character code sequence;

wherein the second terminated code is stored in the text storage area at a position immediately after the first terminated code when the text information stored in the text storage area does not include the 2-byte character code sequence, and the second terminated code is stored in the text storage area at the end of the 2-byte character code sequence when the text information stored in the text storage area includes the 2-byte character code sequence; and wherein a storage position of the first terminated code and a storage position of the second terminated code in the text storage area are indicative of whether the text information is type (a), type (b), or type (c);

a reproducing device operable to reproduce the read out audio information; and a control device operable to control a display unit to display either the 1-byte character code sequence or a 2-byte character code sequence in accordance with the read out type information.

5. A semiconductor memory card for storing audio information with corresponding text information and type information, the type information indicating a type of the text information, wherein the type is classified into at least (a), (b), and (c) in which the text information respectively includes a 1-byte character code sequence, a 2-byte character code sequence, and a 1-byte character code sequence and a 2-byte character code sequence, wherein:

the text information is stored in a text storage area, which is a part of said semiconductor memory card, consecutively from the start of said text storage area;

the type information is a first terminated code and a second terminated code which are included in the text information;

the first terminated code is stored at the start of said text storage area when the text information stored in said text storage area does not include a 1-byte character code sequence, and is stored in said text storage area at the end of a 1-byte character code sequence when the text information stored in said text storage area includes the 1-byte character code sequence;

the second terminated code is stored in said text storage area at a position immediately after the first terminated code when the text information stored in said text storage area does not include a 2-byte character code sequence, and is stored in said text storage area at the end of a 2-byte character code sequence when the text information stored in said text storage area includes the 2-byte character code sequence; and combinations of what is stored at the start of said text storage area, a storage position of the first terminated code, and a storage position of the second terminated code indicate the types (a), (b), and (c).

6. A recording apparatus for recording audio information onto a semiconductor memory card which can be inserted into and/or removed from said recording apparatus, said recording apparatus comprising:

a first recording device operable to record the audio information onto the semiconductor memory card; and a second recording device operable to record text information and type information both corresponding to the audio information onto the semiconductor memory card;

wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence;

wherein said second recording device is operable to record the text information and the type information onto a consecutive area located at the start of a text storage area, the type information being a first terminated code and a second terminated code, wherein said second recording device is operable to record the first terminated code at the start of the text storage area when not recording a 1-byte character code sequence onto the text storage area, and record the first terminated code at the end of a 1-byte character code sequence when recording the 1-byte character code sequence onto the text storage area, wherein said second recording device is operable to record the second terminated code immediately after the first terminated code when not recording a 2-byte character code sequence onto the text storage area, and record the first terminated code at the end of a 2-byte character code sequence when recording the 2-byte character code sequence onto the text storage area; and wherein combinations of what is stored at the start of the text storage area, a storage position of the first terminated code, and a storage position of the second terminated code indicate the types (a), (b), and (c).

7. A recording apparatus for recording audio information onto a semiconductor memory card which can be inserted into and/or removed from said recording apparatus, said recording apparatus comprising:

a first recording device operable to record the audio information onto the semiconductor memory card; and a second recording device operable to record text information and type information both corresponding to the audio information onto the semiconductor memory card;

wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence;

wherein the 1-byte character code sequence includes pairs of a 1-byte tag and a plurality of 1-byte character codes, the 1-byte tag indicating a name of an item, and the plurality of 1-byte character codes indicating a content of the item; and wherein the 2-byte character code sequence includes pairs of a 2-byte tag and a plurality of 2-byte character codes, the 2-byte tag indicating a name of an item, and the plurality of 2-byte character codes indicating a content of the item.

8. A reproducing apparatus for reading out audio information from a semiconductor memory card which can be inserted into and/or removed from said reproducing apparatus and reproducing the read-out audio information, said reproducing apparatus comprising:

a read-out device operable to read out the audio information, text information, and type information from the semiconductor memory card, wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence;

a reproducing device operable to reproduce the read-out audio information; and a control device operable to control a display unit to display either a 1-byte character code sequence or a 2-byte character code sequence in accordance with the read-out type information;

wherein the type information includes a first attribute and a second attribute, the first attribute showing whether the text information includes a 1-byte character code sequence, and the second attribute showing whether the text information includes a 2-byte character code sequence; and wherein said control device is operable to determine a type of the text information based on the first attribute and the second attribute included in the type information, and to allow the display unit to display a character code sequence corresponding to the determined type of the text information.

9. A reproducing apparatus for reading out audio information from a semiconductor memory card which can be inserted into and/or removed from said reproducing apparatus and reproducing the read-out audio information, said reproducing apparatus comprising:

a read-out device operable to read out the audio information, text information, and type information from the semiconductor memory card, wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence;

a reproducing device operable to reproduce the read-out audio information; and a control device operable to control a display unit to display either a 1-byte character code sequence or a 2-byte character code sequence in accordance with the read-out type information;

wherein the text information is stored in a text storage area consecutively from the start of the text storage area;

wherein the type information is a first terminated code and a second terminated code which are included in the text information;

wherein the first terminated code is stored at the start of the text storage area when the text information stored in the text storage area does not include a 1-byte character code sequence, and is stored in the text storage area at the end of a 1-byte character code sequence when the text information stored in the text storage area includes the 1-byte character code sequence;

wherein the second terminated code is stored in the text storage area at a position immediately after the first terminated code when the text information stored in the text storage area does not include a 2-byte character code sequence, and is stored in the text storage area at the end of a 2-byte character code sequence when the text information stored in the text storage area includes the 2-byte character code sequence; and wherein combinations of what is stored at the start of the text storage area, a storage position of the first terminated code, and a storage position of the second terminated code indicate the types (a), (b), and (c).

10. A reproducing apparatus for reading out audio information from a semiconductor memory card which can be inserted into and/or removed from said reproducing apparatus and reproducing the read-out audio information, said reproducing apparatus comprising:

a read-out device operable to read out the audio information, text information, and type information from the semiconductor memory card, wherein the type information indicates a type of the text information, the type being classified into at least (a), (b), and (c) in which the text information respectively includes a 1-byte character code sequence, a 2-byte character code sequence, and a 1-byte character code sequence and a 2-byte character code sequence;

a reproducing device operable to reproduce the read-out audio information; and a control device operable to control a display unit to display either a 1-byte character code sequence or a 2-byte character code sequence in accordance with the read-out type information;

wherein the 1-byte character code sequence includes pairs of a 1-byte tag and a plurality of 1-byte character codes, the 1-byte tag indicating a name of an item, and the plurality of 1-byte character codes indicating a content of the item; and the 2-byte character code sequence includes pairs of a 2-byte tag and a plurality of 2-byte character codes, the 2-byte tag indicating a name of an item, and the plurality of 2-byte character codes indicating a content of the item.

11. A semiconductor memory card for storing audio information and text information that is reproduced in synchronization with the audio information, said semiconductor memory card comprising:

a text storage area having a fixed size;

text information which includes at least one of a 1-byte character code sequence and a 2-byte character code sequence which are stored in said text storage area;

boundary information which is indicative of at least one of a termination of the 1-byte character code sequence and a beginning of the 2-byte character code sequence; and type information which is indicative of whether said text information is type (a), type (b), or type (c) as follows:
    type (a) indicates that said text information includes the 1-byte character code sequence;
    type (b) indicates that said text information includes the 2-byte character code sequence; and
    type (c) indicates that said text information includes the 1-byte character code sequence and the 2-byte character code sequence;

wherein said text information is stored in said text storage area in a consecutive manner from a start of said text storage area;

wherein said type information includes a first terminated code and a second terminated code;

wherein the first terminated code is stored at the start of said text storage area when said text information stored in said text storage area does not include the 1-byte character code sequence, and the first terminated code is stored in said text storage area at the end of the 1-byte character code sequence when said text information stored in said text storage area includes the 1-byte character code sequence;

wherein the second terminated code is stored in said text storage area at a position immediately after the first terminated code when said text information stored in said text storage area does not include the 2-byte character code sequence, and the second terminated code is stored in said text storage area at the end of the 2-byte character code sequence when the text information stored in said text storage area includes the 2-byte character code sequence; and wherein the boundary information is obtained based on a position of the first terminated code which indicates the termination of the 1-byte character code sequence.

12. A recording apparatus for recording audio information, and text information that is reproduced in synchronization with the audio information, onto a semiconductor memory card which can be inserted into and/or removed from said recording apparatus, the semiconductor memory card including a text storage area having a fixed size, said recording apparatus comprising:

a first recording device operable to record audio information onto the semiconductor memory card; and a second recording device operable to record text information, type information, and boundary information, each of which corresponds to the audio information, onto the semiconductor memory card;

wherein the text information includes at least one of a 1-byte character code sequence and a 2 byte character code sequence which are stored in the text storage area;

wherein the boundary information is indicative of at least one of a termination of the 1-byte character code sequence and a beginning of the 2-byte character code sequence;

wherein the type information is indicative of whether the text information is type (a), type (b), or type (c) as follows:
    type (a) indicates that the text information includes the 1-byte character code sequence;
    type (b) indicates that the text information includes the 2-byte character code sequence; and
    type (c) indicates that the text information includes the 1-byte character code sequence and the 2-byte character code sequence;

wherein said second recording device is operable to record the text information in the text storage area in a consecutive manner from a start of the text storage area;

wherein the type information includes a first terminated code and a second terminated code;

wherein the first terminated code is stored at the start of the text storage area when the text information stored in the text storage area does not include the 1-byte character code sequence, and the first terminated code is stored in the text storage area at the end of the 1-byte character code sequence when the text information stored in the text storage area includes the 1-byte character code sequence;

wherein the second terminated code is stored in the text storage area at a position immediately after the first terminated code when the text information stored in the text storage area does not include the 2-byte character code sequence, and the second terminated code is stored in the text storage area at the end of the 2-byte character code sequence when the text information stored in the text storage area includes the 2-byte character code sequence; and wherein the boundary information is obtained based on a position of the first terminated code which indicates the termination of the 1-byte character code sequence.

13. A recording/reproducing apparatus for recording/reading audio information, and text information that is reproduced in synchronization with the audio information, to/from a semiconductor memory card which can be inserted into and/or removed from said recording/reproducing apparatus, the semiconductor memory card including a text storage area having a fixed size, said recording/reproducing apparatus comprising:

a first recording device operable to record audio information onto the semiconductor memory card; and a second recording device operable to record text information, type information, and boundary information, each of which corresponds to the audio information, onto the semiconductor memory card;

a read-out device operable to read out audio information and corresponding text information, type information, and boundary information from the semiconductor memory card;

wherein the text information includes at least one of a 1-byte character code sequence and a 2-byte character code sequence which are stored in the text storage area;

wherein the boundary information is indicative of at least one of a termination of the 1-byte character code sequence and a beginning of the 2-byte character code sequence;

wherein the type information is indicative of whether the text information is type (a), type (b), or type (c) as follows:
    type (a) indicates that the text information includes the 1-byte character code sequence;
    type (b) indicates that the text information includes the 2-byte character code sequence; and
    type (c) indicates that the text information includes the 1-byte character code sequence and the 2-byte character code sequence;

a reproducing device operable to reproduce the read out audio information; and a control device operable to control a display unit to display either the 1-byte character code sequence or a 2-byte character code sequence in accordance with the read out type information;

wherein said second recording device is operable to record the text information in the text storage area in a consecutive manner from a start of the text storage area;

wherein said read-out device is operable to read out the text information from the text storage area in a consecutive manner from a start of the text storage area;

wherein the type information includes a first terminated code and a second terminated code;

wherein the first terminated code is stored at the start of the text storage area when the text information stored in the text storage area does not include the 1-byte character code sequence, and the first terminated code is stored in the text storage area at the end of the 1-byte character code sequence when the text information stored in the text storage area includes the 1-byte character code sequence;

wherein the second terminated code is stored in the text storage area at a position immediately after the first terminated code when the text information stored in the text storage area does not include the 2-byte character code sequence, and the second terminated code is stored in the text storage area at the end of the 2-byte character code sequence when the text information stored in the text storage area includes the 2-byte character code sequence; and wherein the boundary information is obtained based on a position of the first terminated code which indicates the termination of the 1-byte character code sequence.

14. A reproducing apparatus for reading audio information, and text information that is reproduced in synchronization with the audio information, from a semiconductor memory card which can be inserted into and/or removed from said reproducing apparatus, the semiconductor memory card including a text storage area having a fixed size, said reproducing apparatus comprising:

a read-out device operable to read out audio information and corresponding text information, type information, and boundary information from the semiconductor memory card;

wherein the text information includes at least one of a 1-byte character code sequence and a 2-byte character code sequence which are stored in the text storage area;

wherein the boundary information is indicative of at least one of a termination of the 1-byte character code sequence and a beginning of the 2-byte character code sequence; and wherein the type information is indicative of whether the text information is type (a), type (b), or type (c) as follows:

type (a) indicates that the text information includes the 1-byte character code sequence;

type (b) indicates that the text information includes the 2-byte character code sequence; and type (c) indicates that the text information includes the 1-byte character code sequence and the 2-byte character code sequence;

a reproducing device operable to reproduce the read out audio information; and a control device operable to control a display unit to display either the 1-byte character code sequence or a 2-byte character code sequence in accordance with the read out type information;

wherein said read-out device is operable to read out the text information from the text storage area in a consecutive manner from a start of the text storage area;

wherein the type information includes a first terminated code and a second terminated code;

wherein the first terminated code is stored at the start of the text storage area when the text information stored in the text storage area does not include the 1-byte character code sequence, and the first terminated code is stored in the text storage area at the end of the 1-byte character code sequence when the text information stored in the text storage area includes the 1-byte character code sequence;

wherein the second terminated code is stored in the text storage area at a position immediately after the first terminated code when the text information stored in the text storage area does not include the 2-byte character code sequence, and the second terminated code is stored in the text storage area at the end of the 2-byte character code sequence when the text information stored in the text storage area includes the 2-byte character code sequence; and wherein the boundary information is obtained based on a position of the first terminated code which indicates the termination of the 1-byte character code sequence.

* * * * *